United States Patent
Chavali et al.

(10) Patent No.: US 10,553,453 B2
(45) Date of Patent: Feb. 4, 2020

(54) SYSTEMS AND METHODS FOR SEMICONDUCTOR PACKAGES USING PHOTOIMAGEABLE LAYERS

(71) Applicant: Intel Corporation, Santa Clara, CA (US)

(72) Inventors: Sri Chaitra Chavali, Chandler, AZ (US); Siddharth K. Alur, Chandler, AZ (US); Amanda E. Schuckman, Scottsdale, AZ (US); Amruthavalli Palla Alur, Chandler, AZ (US); Islam A. Salama, Chandler, AZ (US); Yikang Deng, Chandler, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/317,789

(22) PCT Filed: Jul. 14, 2016

(86) PCT No.: PCT/US2016/042285
§ 371 (c)(1),
(2) Date: Jan. 14, 2019

(87) PCT Pub. No.: WO2018/013121
PCT Pub. Date: Jan. 18, 2018

(65) Prior Publication Data
US 2019/0311916 A1 Oct. 10, 2019

(51) Int. Cl.
*H05K 1/03* (2006.01)
*H05K 3/00* (2006.01)
(Continued)

(52) U.S. Cl.
CPC ........ *H01L 21/486* (2013.01); *H01L 21/4857* (2013.01); *H01L 23/49822* (2013.01);
(Continued)

(58) Field of Classification Search
CPC ...... H05K 1/03; H05K 1/0306; H05K 3/0023; H05K 3/287; H05K 2201/0166
See application file for complete search history.

(56) References Cited

U.S. PATENT DOCUMENTS

2005/0186768 A1  8/2005  Yasuhiro et al.
2011/0115090 A1  5/2011  Lin
(Continued)

OTHER PUBLICATIONS

International Search Report and Written Opinion for PCT Application No. PCT/US2016/042285, dated Apr. 14, 2017, 11 pages.

*Primary Examiner* — Jeremy C Norris
(74) *Attorney, Agent, or Firm* — Eversheds Sutherland (US) LLP

(57) ABSTRACT

Various embodiments of the disclosure are directed to a semiconductor package and a method for fabrication of the semiconductor package. Further, disclosed herein are systems and methods that are directed to using a photoimagable dielectric (PID) layer with substantially similar mechanical properties as that of a mold material. The disclosure can be used, for example, in the context of bumpless laserless embedded substrate structures (BLESS) technology for wafer/panel level redistribution layer (RDL) and/or fan-out packaging applications. The disclosed embodiments may reduce the need for multiple dry resist film (DFR) lamination steps during various processing steps for semiconductor packaging and can also facilitate multiple layer counts due to the availability of thin PID materials.

20 Claims, 26 Drawing Sheets

(51) Int. Cl.
*H01L 21/48* (2006.01)
*H01L 23/498* (2006.01)
*H01L 23/00* (2006.01)
*H01L 23/522* (2006.01)
*H01L 23/532* (2006.01)

(52) U.S. Cl.
CPC .... *H01L 23/49866* (2013.01); *H01L 23/5226* (2013.01); *H01L 23/53228* (2013.01); *H01L 24/03* (2013.01); *H01L 24/06* (2013.01); *H05K 1/03* (2013.01); *H05K 3/0023* (2013.01)

(56) References Cited

U.S. PATENT DOCUMENTS

2014/0361439 A1 12/2014 Su
2015/0279777 A1 10/2015 Hsu
2016/0141262 A1 5/2016 Hu

FIG. 4A

418 — Form pads in the patterned dry film resist layers and the patterned first photoimageable dielectric layers on both sides of the carrier to produce a first structure 420 — Remove the dry resist layers from the first structure 422 — Process the pads to treat the surface of the pads on both sides of the carrier 424 — Form photoimageable dielectric layers on the treated pads and the patterned photoimageable dielectric layers on both sides of the carrier 426 — Process the photoimageable dielectric layers to pattern the photoimageable dielectric layers on both sides of the carrier 428 — Form metal layers on the patterned photoimageable dielectric layers on both sides of the carrier 430 — Form dry film resist layers on the patterned photoimageable dielectric layers on both sides of the carrier 432 — Process the dry film resist layers to pattern the dry film resist layers on both sides of the carrier

┌─ 434
Form pads in the patterned dry film resist layers and the patterned photoimageable dielectric layers on both sides of the carrier to produce a first structure ┌─ 436
Remove the dry resist layers from the first structure on both sides of the carrier ┌─ 438
Repeat the foregoing steps 422-436 to generate multiple photoimageable dielectric lamination layers with embedded pads ┌─ 440
Attach dies at corresponding cavities on both sides of the carrier ┌─ 442
Form photoimageable dielectric layers on both sides of the carrier ┌─ 444
Plate the photoimageable dielectric layers with pads on both sides of the carrier to form a second structure ┌─ 446
Detach the second structure from both sides of the carrier comprising the treated first metal layers ┌─ 448
Form photoresist layers on the photoimageable dielectric layer plated with pads therein on the detached first and second portions of the second structure ┌─ 450
Process the photoresist layers to pattern the photoresist layers

END

FIG. 4C

SYSTEMS AND METHODS FOR SEMICONDUCTOR PACKAGES USING PHOTOIMAGEABLE LAYERS

CROSS-REFERENCE TO RELATED APPLICATION(S)

This application is a U.S. National Stage Application under 35 U.S.C. 371 and claims the priority benefit of PCT International Application No. PCT/US2016/042285, filed Jul. 14, 2016, the disclosure of which is incorporated herein by reference as if set forth in full.

TECHNICAL FIELD

This disclosure generally relates to semiconductor packages, and more particularly to semiconductor packages having a photoimagable layer.

BACKGROUND

Various approaches towards the fabrication and application of semiconductor packages, for example, Molded Interconnection System Ball Grid Array (MIS-BGA) architectures have various constraints. For example, packages (e.g., the MIS-BGA architectures) can have constraints in terms of the supporting a limited number of layers, having higher z-heights involving potentially expensive grinding steps. Moreover, such approaches have not found many applications outside of panel-based manufacturing processes.

BRIEF DESCRIPTION OF THE FIGURES

Reference will now be made to the accompanying drawings, which are not necessarily drawn to scale, and wherein:

FIGS. 1A-1K show diagrams of an example process flow of a photoimagable dielectric layer based Bumpless Laserless Embedded Substrate Structure (BLESS) architecture, in accordance with example embodiments of the disclosure.

FIGS. 4A-4C show second flowcharts of example operations for a second example of the fabrication of an example semiconductor package having the photoimagable dielectric layer based BLESS architecture, in accordance with example embodiments of the disclosure.

DETAILED DESCRIPTION OF EMBODIMENTS OF THE DISCLOSURE

Figure 1A:
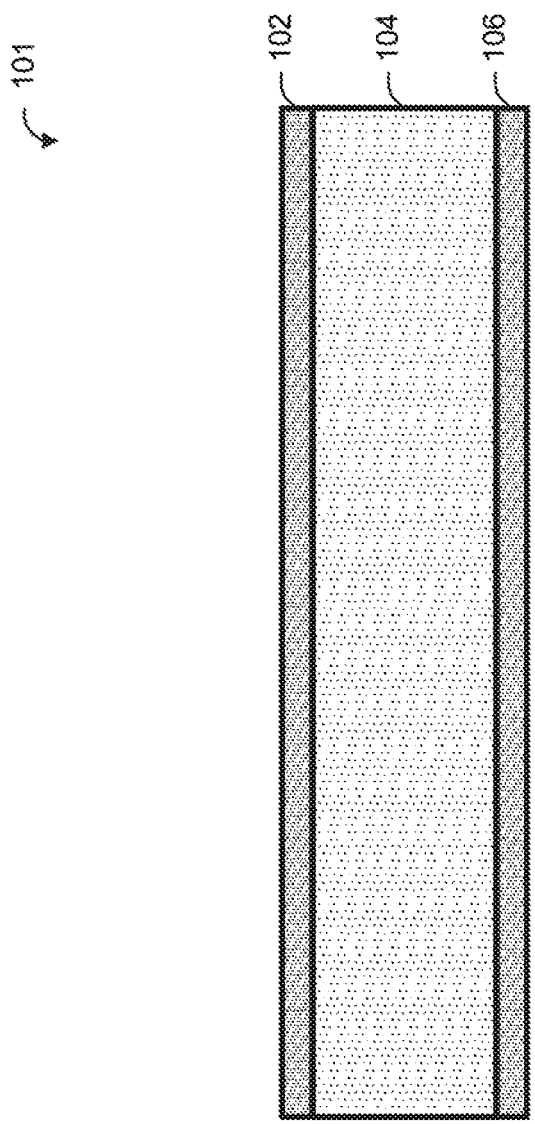

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical" as used herein may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or the removal of the material or photoresist as required in forming a described structure.

As mentioned, the fabrication and application of Molded Interconnection System Ball Grid Array (MIS-BGA) architectures can have various constraints, for example, in terms of the supporting a limited number of layers, having higher z-heights, involving potentially expensive grinding steps. Moreover, such approaches have not found many applications outside of panel-based manufacturing processes. The limited layer count limitation can be caused by a combination of factors, a first being associated with copper pillar heights, and a second being a low availability of thin mold film materials. The higher cost can be at least partially driven by the possible necessity of multiple dry resist film (DFR) fabrication steps to plate thick copper pillars, and to later grind the mold material.

Embodiments of the disclosure may provide a semiconductor package and a method for fabrication of the semiconductor package. Further, disclosed herein are systems and methods that are directed to using a photoimagable dielectric (PID) layer with substantially similar mechanical properties as that of a mold material. The disclosure can be used, for example, in the context of bumpless laserless embedded substrate structures (BLESS) technology for wafer/panel level redistribution layer (RDL) and/or fan-out packaging applications. The disclosed embodiments may reduce the need for multiple dry resist film (DFR) lamination steps during various processing steps for semiconductor packaging and can also facilitate multiple layer counts due to the availability of thin PID materials. Furthermore, the process of implementing the disclosure is not limited to panel based packages, as PID layers laminated on silicon wafers can additionally find use with redistribution layer (RDL) and/or fan-out packaging applications.

In one embodiment, the disclosed PID layer can be used to replace thick molded material used in multiple layers of the BLESS architecture without compromising one or more z-height requirements in the package design. Further, the disclosed embodiments can lead to, in accordance with various example embodiments, the avoidance and/or the elimination of additional grinding steps that are typically performed for similar processes that use mold layers. This can be, for example, because various copper pillars can be plated after the PID layer is developed. The disclosed embodiments may additionally lead to a multiple layer count. This may not be possible with thick mold material; however for the thin PID materials (approximately 5 micrometers (um) in thickness, and also available off-the-shelf) disclosed, the multiple layer count can be possible.

Moreover, the disclosed embodiments can reduce processing and/or fabrication costs, for example, by reducing capital costs by enabling currently non-existent molding processing steps at substrate suppliers. Further cost reduction can be achieved because of the elimination of one DFR step per layer, and by eliminating one or more grinding and laser processing steps of previous systems and methods.

In another embodiment of the disclosure can include providing greater functionality in packaging, for example, in that components such as capacitors, resistors, and discrete inductors can be incorporated into the package with ease. Moreover, several layers of PID can be laminated and exposed to create a thicker layer of dielectric in which thicker components can be embedded. As such, there can be fewer restrictions on the depth of cavity in connection with the semiconductor package. Thus, the disclosed embodiments can improve cavity depth flexibility; for example, cavities at smaller and/or greater depths can be opened using the one or more PID layer(s) more easily than with existing methods and systems. Moreover, the disclosed embodiments can improve fine line and space (L/S) of the semiconductor package. For example, the PID can serve as a build-up (BU) material that can help reduce the pitch and feature size, and can therefore allow for better scaling. When laminated and patterned on a silicon wafer, the PID layer can enable redistribution layers (RDLs) and/or fan-out packaging. Further, the use of RDL/fan-out packaging using the disclosed systems and methods can be performed on wafers as well as on the panel level.

In various aspects, the disclosure can be used in connection with central processing units (CPUs), and or general processors, chipsets, graphics devices, wireless devices, multi-chip/3D-package including CPU in combo with other devices, memory (e.g., FLASH/DRAM/SRAM and the like) boards (e.g., motherboards), and the like.

In various embodiments of the disclosure, the term substrate can refer to a solid (usually planar) substance onto which a layer of another substance is applied, and to which that second substance adheres. The substrate can include, but not be limited to, a slice of material such as silicon, silicon dioxide, aluminum oxide, sapphire, germanium, gallium arsenide (GaAs), an alloy of silicon and germanium, or indium phosphide (InP), or any suitable material.

In an embodiment, an intermediate structure is disclosed, the intermediate structure can represent a structure that is formed during any of the processing steps disclosed herein. The intermediate structure can be represented by FIG. t and can include a carrier, the carrier can comprise a sacrificial material; the carrier can further comprise a metal layer, for example, a copper layer. The metal layer can include a first patterned photoimagable dielectric (PID) layer and a second patterned PID layer. The PID layers can further include a plurality of metal pads. The metal pads can comprise copper and can be plated into the PID layers. The structure can further include a patterned solder mask material layer. The solder mask material layer can include a resist material, for example, a photoresist material layer.

FIGS. 1A-1K shows diagrams of an example process flow of a photoimagable dielectric layer based Bumpless Laserless Embedded Substrate Structure (BLESS) architecture, in accordance with example embodiments of the disclosure.

FIG. 1A shows a diagram 101 of a carrier 104 comprising a layer of sacrificial material. Further first layers 102 and 106 can be formed on the carrier, for example, on opposite sides of the carrier 104. The sacrificial material can include, but not be limited to, a slice of material such as silicon, silicon dioxide, aluminum oxide, sapphire, germanium, gallium arsenide (GaAs), an alloy of silicon and germanium, or indium phosphide (InP).

In various embodiments, the first layers 102 and 106 can comprise a metallic, semi-metallic, or intermetallic material. In various embodiments, the first layers 102 and 106 can comprise a metallic material. Non-limiting examples include gold, copper, silver, aluminum, zinc, tin, platinum, and any of the like. Metallic materials may also be any alloys of such materials.

In various embodiments, the first layer 102 and 106 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the 102 and 106 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various embodiments, the first layers 102 and 106 can be any suitable thickness, for example, approximately 1 μm to approximately 1,000 μm thick, with a further example thickness of approximately 15 μm to approximately 30 μm thick. The layers 102 and 106 can be deposited via sputtering, paste printing, squeegee, atomic layer deposition (ALD), or a variety of different physical vapor deposition (PVD) techniques. The layers 102 and 106 may be laminated on top of the carrier 104 by any suitable process, including, for example, cold roll or hot roll. In example embodiments, the layer 102 and 106 may be hot pressed on top of the carrier 104 at a predetermined temperature and pressure. Additionally the layer can be deposited via any of the above mentioned techniques (or others that are not explicitly named herein) and then picked and placed on the carrier 104, or laminated thereon, or positioned atop the carrier 104 via any other technique.

Figure 1B:
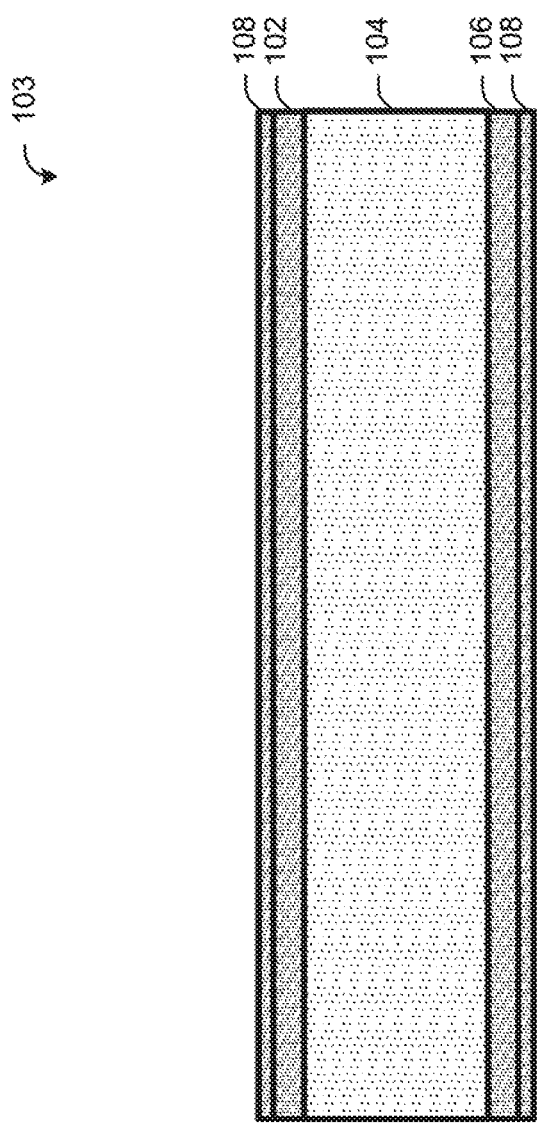

FIG. 1B shows a diagram 103 of the carrier 104, the first layers 102 and 106, and a processed portion of the first layer 108. The processed portion 108 of the first layers 106 and 102 can further include a copper roughening treatment of the first metal layers 102 and 106, for example, to promote the adhesion of following layer depositions, for example, various polymer and/or dielectric layers as described below. The copper roughening treatment can include the application of a surface roughening agent, for example, an organic acid-type microetching solution, that creates a roughened surface of the metal layers 102 and 106. The roughened metal surface topography can help to achieve high metal-to-dry film, polymer and/or resin adhesion. In one embodiment, the metal roughening treatment can make the processed portion of the metal layers 108 have approximately a 0.1 µm to an approximately 5 µm average surface roughness, as measured, for example, by a surface profile measurement. In one embodiment, the surface roughness of the processed first metal layers 108 can be increased by applying the surface roughening treatment on the surface of the metal layers for a longer period of time, for example, approximately 10 minutes versus approximately 20 minutes.

Alternatively or additionally, in another embodiment, the processed first metal layers 108 can further comprise an adhesion promoting treatment of the first metal layers 102 and 106. The adhesion promotion treatment can include a liquid or gaseous adhesion promoter, such as bis(trimethylsilyl)amine ("hexamethyldisilazane", HMDS), being applied to promote adhesion of a photoimagable dielectric layer (see 110 of FIG. 1C and description below). The adhesion promotion treatment can be used to enhance the fine line space (FLS) of the semiconductor package. This FLS can lead to better routing, better form factor, and/or better substrate design parameters.

Figure 1C:
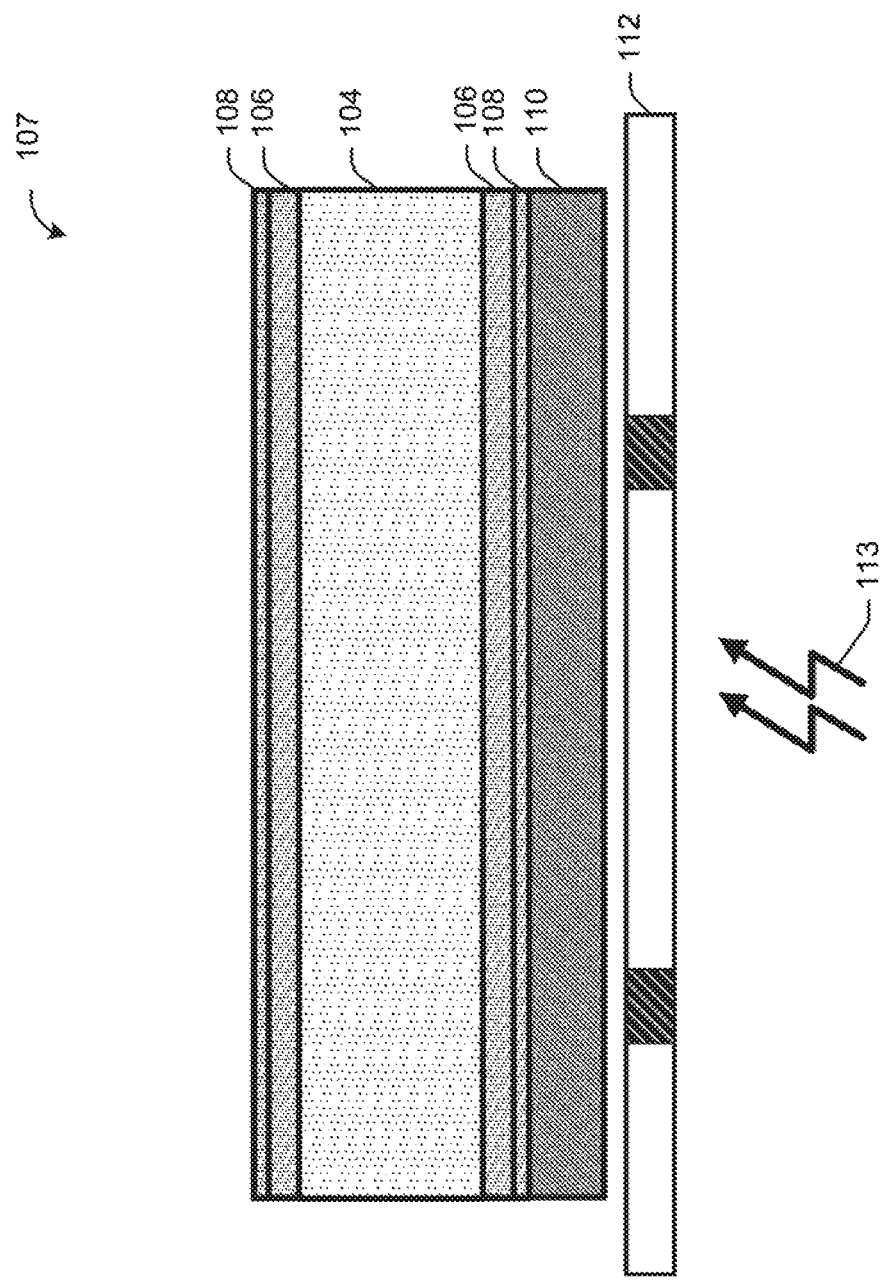

FIG. 1C shows a diagram 107 of the carrier 104, the first layers 102 and 106, the processed portion of the first layer 108, and a first photoimagable dielectric layer 110 on one of the treated first metal layers 108. In one embodiment, the first photoimagable dielectric layer 110 further comprises the first photoimagable dielectric layer 110 being laminated on the treated first metal layer 108. In one embodiment, the light types 113 that can be used to image the photoimagable dielectric layer 110 can include, but not be limited to, UV, DUV (Deep UV), and the g and I lines having wavelength of approximately 436 nm and approximately 365 nm, respectively, of a mercury-vapor lamp. In one embodiment, the developing light wavelength parameter can be related to the thickness of the applied photoimagable dielectric layer 110, with thinner layers corresponding to shorter wavelengths. This can permit a reduced aspect ratio and a reduced minimum feature size.

In various embodiments, the photoimagable dielectric layer 110 can be any suitable thickness, for example, approximately 1 µm to approximately 1,000 µm thick, with a further example thickness of approximately 1 µm to approximately 40 µm thick.

In one embodiment, various chemicals may be used for permanently giving the photoimagable dielectric layer 110 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, the photoimagable dielectric layer 110 can include a dry film. The dry film can stand alone amongst the other types in that the coating already exists as a uniform thickness, semi-solid film coated onto a polyester substrate and the user applies that substrate to the treated first metal layer 108 by lamination.

Figure 1D:
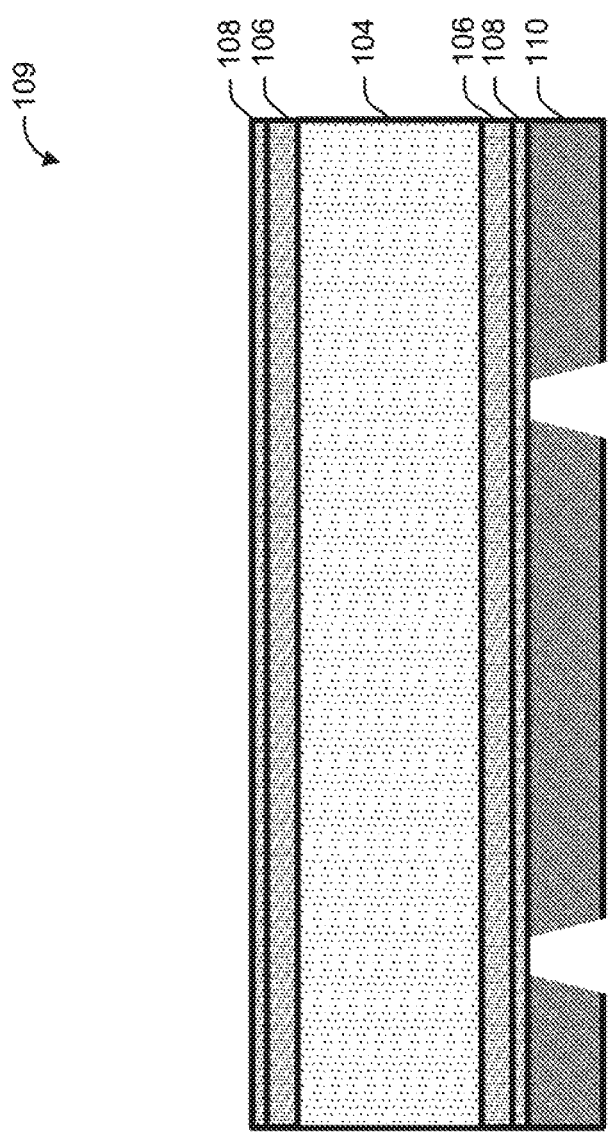

FIG. 1D shows a diagram 109 of the carrier 104, the first layers 102 and 106, the processed portion of the first layer 108, and a patterned first photoimagable dielectric layer 110 on one of the treated first metal layers 108.

The first photoimagable dielectric layer 110 can be processed to pattern the first photoimagable dielectric layer 110. In one embodiment, processing the first photoimagable dielectric layer 110 can further include exposing the first photoimagable dielectric layer 110 using a mask 112 (for example, the mask 112 of FIG. 1C). The mask can include, for example, a photomask 112, which can refer to an opaque plate with holes or transparencies that allow light to shine through in a defined pattern. In one embodiment, the photomask 112 can include transparent fused silica blanks covered with a pattern defined with a chrome metal-absorbing film. In another embodiment, the photomask 112 can be used at a predetermined wavelength, including, but not be limited to, approximately 436 nm, approximately 365 nm, approximately 248 nm, and approximately 193 nm. In one embodiment, there can be a one-to-one correspondence between the mask pattern and the photoimagable dielectric layer pattern, for example, using one-to-one mask aligners. In other embodiments, steppers and scanners with reduction optics can be used to project and shrink the pattern by four or five times onto the surface of the photoimagable dielectric layer 110. To achieve complete coverage, the photoimagable dielectric layer 110 can be repeatedly "stepped" from position to position under the optical column until full exposure is achieved.

In one embodiment, processing the first photoimagable dielectric layer 110 further comprises curing the first photoimagable dielectric layer 110 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

Figure 1E:
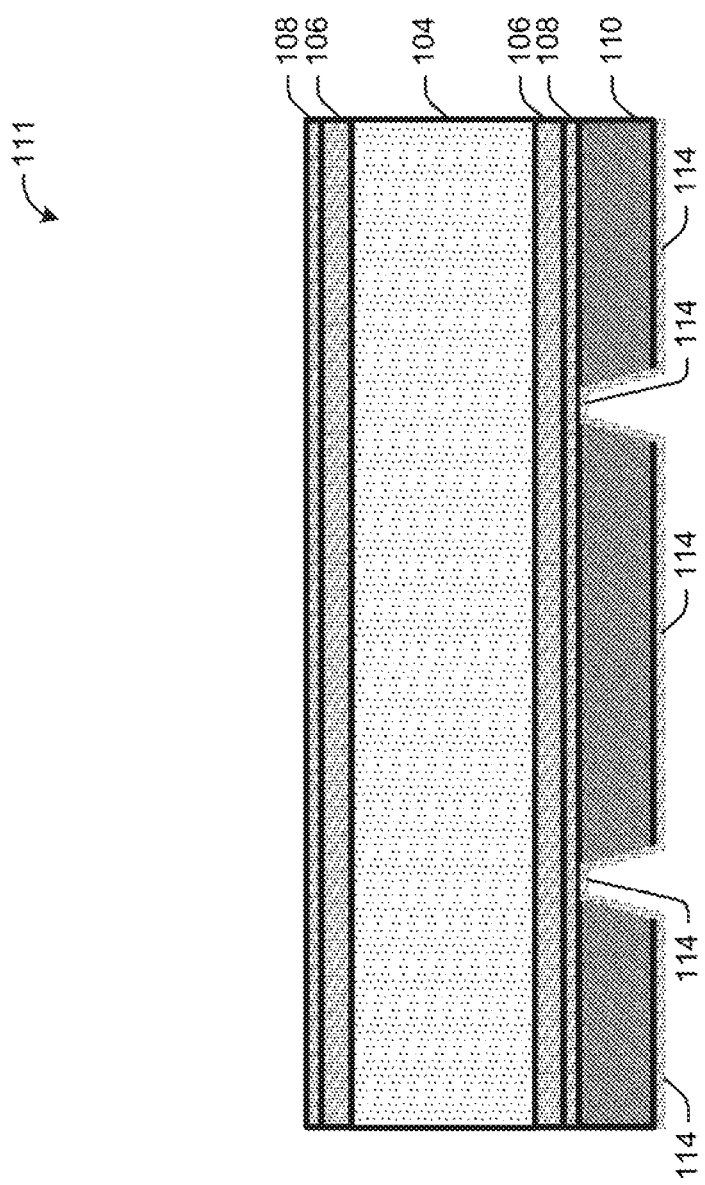

FIG. 1E shows a diagram 111 of the carrier 104, the first layers 102 and 106, the processed portion of the first layer 108, a patterned first photoimagable dielectric layer 110 on one of the treated first metal layers 108, and a metal layer 114 on the patterned first photoimagable dielectric layer 110. In one embodiment, the metal layer 114 can be formed by electrodeless plating the metal layer 114 on the patterned first photoimagable dielectric layer 110.

Electroless plating, also known as chemical or autocatalytic plating, can refer to a non-galvanic plating method that involves several simultaneous reactions in an aqueous solution, which occur without the use of external electrical power. The solution for the electroless process may need to contain a reducing agent. Electroless plating can use a redox reaction to deposit metal on an object without the passage of an electric current. Because it allows a constant metal ion concentration to bathe all parts of the object, it can deposit metal evenly along edges, inside holes, and over irregularly shaped objects which are difficult to plate evenly with electroplating.

In one embodiment, the metal layer 114 can include a copper layer. The formation of the metal layer can be done at least in part by a wet process and/or a sputter type process. Copper can be plated by reducing complexed copper with formaldehyde in alkaline solution. The reaction can be catalyzed by palladium.

Alternatively or additionally, in various embodiments, a sputter seed process can be used for the formation of the metal layer 114. The sputtering process can be performed, for example, to increase the fine line spacing (FLS) of the semiconductor package. The sputter seed process can include sputtering of a Ti/Cu layer, or a Cu alloy layer. The sputtering can be, for example, a radio-frequency (RF) sputtering deposition, an ion-beam sputtering deposition, a reactive sputtering deposition, ion-assisted sputtering deposition, high-target-utilization sputtering deposition, and/or gas flow sputtering deposition.

Figure 1F:
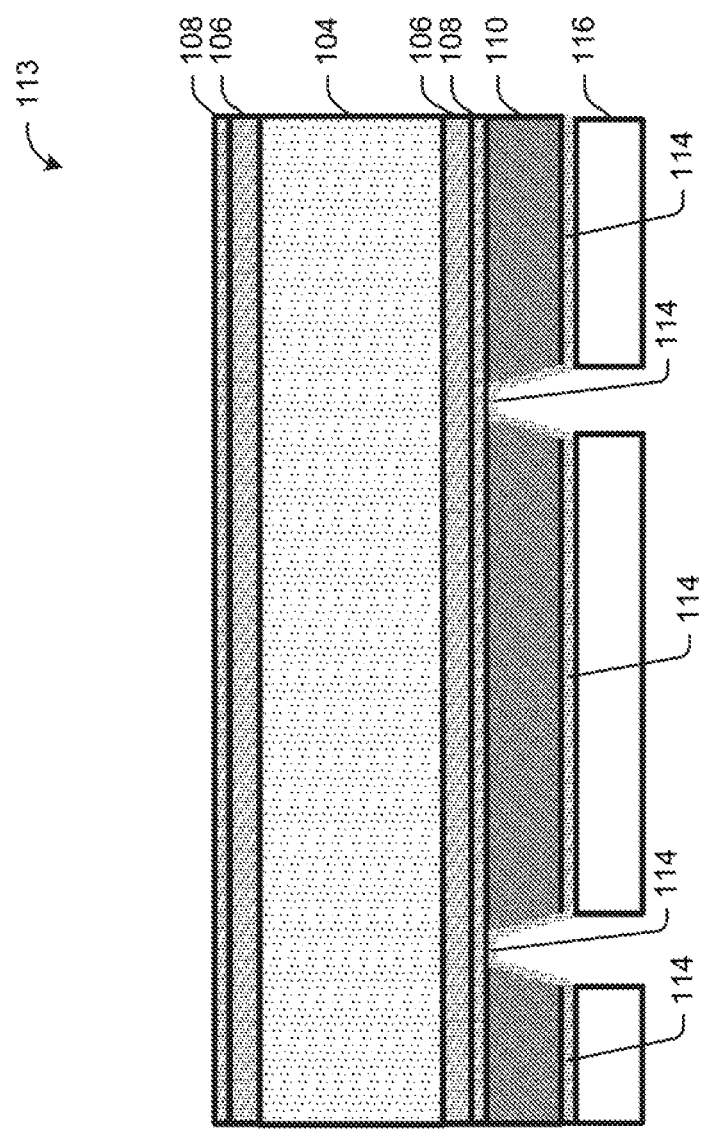

FIG. 1F shows a diagram 113 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, and a first dry film resist layer 116 on the patterned first photoimagable dielectric layer 110 and metal layer 114.

In one embodiment, the first dry film layer 116 can be formed by laminating the first dry film layer 116 on the patterned first photoimagable dielectric layer 110 and the metal layer 114. In another embodiment, the first dry film resist layer 116 may be deposited by any suitable mechanism including, but not limited to, physical vapor deposition, chemical vapor deposition, sputtering, metal paste deposition, combinations thereof, or the like.

Further, the first dry film resist layer 116 can be processed to pattern the first dry film resist layer 116. In various embodiments, the processing of the dry film resist layer can be performed using various tools including, but not limited to, a negative developer, an exposure kit, transparency film, and a foam brush, a laminator, a cutting device (for example, a sharp scissors or fabric cutter), and/or a safelight (for example, a working area lit by a yellow or red 40 watt incandescent bulb).

The formation of the first dry film resist layer 116 can further include, generally, creating a safelight environment, the application of the dry film resist, exposure of the dry film resist, development of the dry film resist, and stripping (after use) of the dry film resist.

Figure 1G:
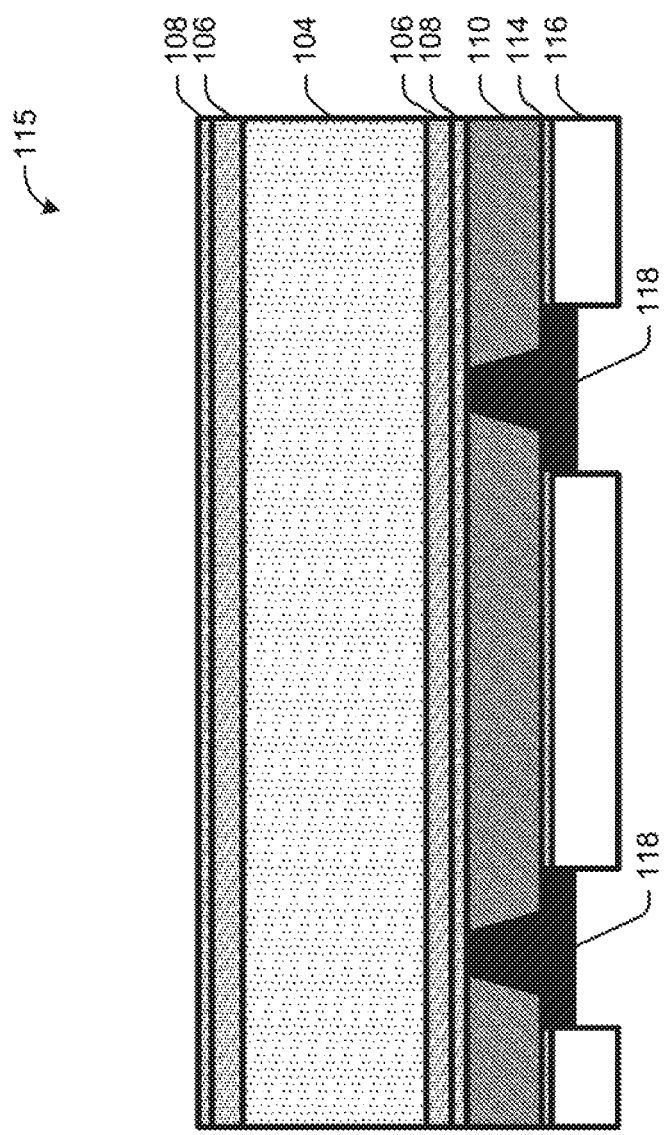

FIG. 1G shows a diagram of a first structure 115 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, the first dry film resist layer 116, and pads 118.

The pads 118 can be formed in the patterned first dry film resist layer 116 and the patterned first photoimagable dielectric layer 110 to produce a first structure 115. The pads 118 can be formed using electrolytic plating (also known as electroplating) pad metal layers 118 in the patterned first dry film resist layer 116 and the patterned first photoimagable dielectric layers 110.

In one embodiment, the electroplating can use electrodeposition, for example, using electric current to reduce dissolved metal cations so that they form a coherent metal coating in contact with the first metal layer 108.

In one embodiment, a first a seed layer of metal (for example, a copper seed layer) may be first generated for the electroplating process. This seed layer may be deposited by sputter technology. In one embodiment, the first step may include wetting of the structure 115. During this process all trenches and vias (for example, those created in the patterning) can be filled with water without any bubbles remaining. This can be performed using detergents or by ultrasound systems.

The structure 115 can then be flooded with electrolyte or sprayed by a rotating set of nozzles. This process may require temperature control. The metal ions can thereby be discharged and deposited on the seed layer, which can act as the cathode. Finally, the structure 115 may need to be cleaned and dried (for example, using an oven).

The pads 118 can comprise copper, but also other metals can be plated. Non-limiting examples include gold, silver, aluminum, zinc, tin, platinum, and any of the like. Metallic materials may also be any alloys of such materials.

Figure 1H:
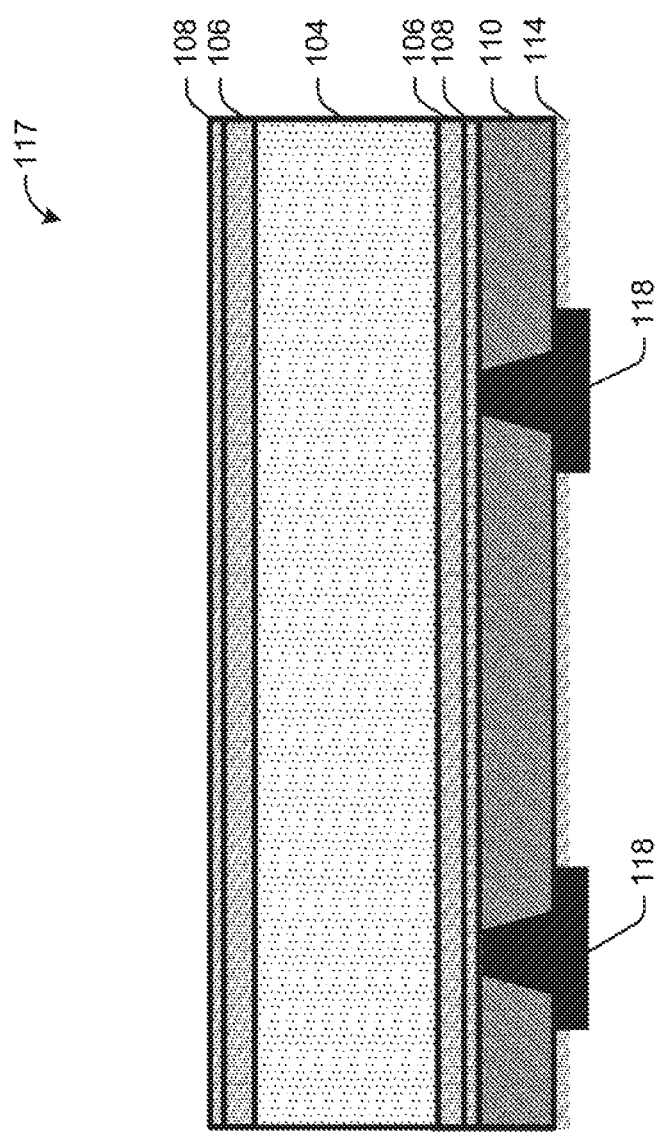
Figure 11:
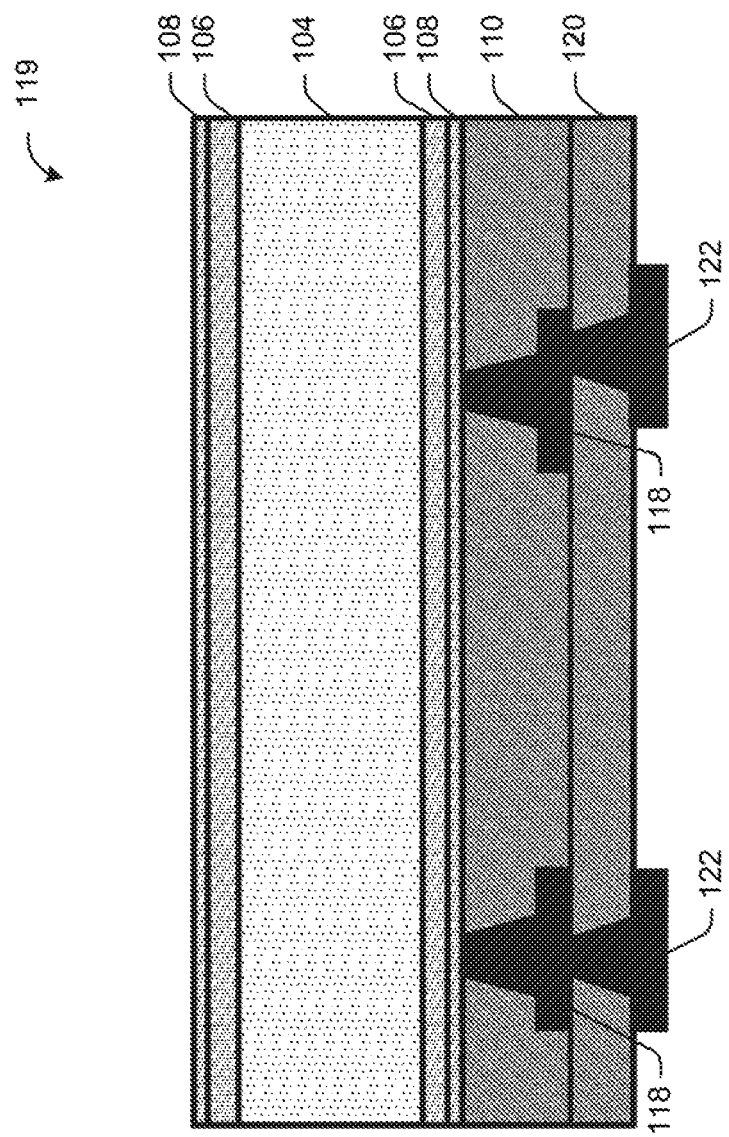

FIG. 1H shows a diagram 117 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, and the pads 118, where the dry resist layer 116 of FIG. 1G has been removed from the first structure 115 of FIG. 1G.

In one embodiment, removing the dry resist layer 116 can further include striping the dry film resist layer 116 from the first structure 115 of FIG. 1G. Removing the dry resist layer 116 of FIG. 1G can use a liquid resist stripper, which chemically alters the resist so that it no longer adheres to the underlying layers. The resist stripper can comprise organic materials specifically formulated to remove the dry resist layer. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the dry resist layer 116 of FIG. 1G can further include etching the first structure 115 of FIG. 1G. In another embodiment, the etching can include a flash etch. In one embodiment, the dry resist layer 116 of FIG. 1G can be etched with a piranha etch, including sulfuric acid and hydrogen peroxide.

In one embodiment, the removal of the dry resist layer 116 may be controlled approximately using the etching time and the known etch rate. In one embodiment, the etching entirely removes the dry resist layer of the structure 115 of FIG. 1G, without damaging the underlying layers. This can be done in part based on the ratio of etch rates in the two materials (selectivity). In various embodiments, the etching can include an anisotropic etch that produces sharp, well-controlled features.

FIG. 1I shows a diagram 119 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, and the pads 118, a second photoimagable dielectric layer 120 on the treated first pad 118 and the patterned first photoimagable dielectric layer 110, and additional pads 122 in the second photoimagable dielectric layer 120. While metal layer 114 is not shown hereinafter, it is still present.

In various embodiments, the first pads 118 can be processed to treat the surface of the first pads. The processing can further include a copper roughening treatment of the first pads 118, for example, to promote the adhesion of the following layers, e.g., a polymer layer. In one embodiment, the metal roughening treatment can make the first pad 118 have approximately a 0.1 micrometers (um) to an approximately 5 μm average surface roughness, as measured, for example, by a surface profile measurement.

Further, the second photoimagable dielectric layer 120 can be formed on the treated first pad 118 and the patterned first photoimagable dielectric layer 110. In one embodiment, the formation of the second photoimagable dielectric layer 120 further comprises laminating the second photoimagable dielectric layer 120 on the treated first pads 118 and the patterned first photoimagable dielectric layer 110. In another embodiment, the second photoimagable dielectric layer 120 may be deposited by any suitable mechanism including, but not limited to, physical vapor deposition, chemical vapor deposition, sputtering, metal paste deposition, combinations thereof, or the like.

In one embodiment, the (second) photoimagable dielectric layer 120 can include a dry film. The dry film can stand alone amongst the other types in that the coating already exists as a uniform thickness, semi-solid film coated onto a polyester substrate and the user applies that substrate to the treated first pads 118 and the patterned first photoimagable dielectric layer 110 by lamination.

Further, various intermediate steps in generating the structure shown in the diagram 119 can include the second photoimagable dielectric layer 120 being processed to pattern the second photoimagable dielectric layer 120, similar, but not necessarily identical to the discussion related to FIG. 1C.

The intermediate steps can further include a third metal layer (not shown) can be formed on the patterned second photoimagable dielectric layer. In one embodiment, the forming the third metal layer can further include electrodeless plating the third metal layer on the patterned second photoimagable dielectric layer 120. Electroless plating, also known as chemical or auto-catalytic plating, can refer to a non-galvanic plating method that involves several simultaneous reactions in an aqueous solution, which occur without the use of external electrical power. The solution for the electroless process may need to contain a reducing agent.

In one embodiment, the various intermediate steps in generating the structure shown in the diagram 119 can include a second dry film resist layer (not shown) being formed on the patterned second photoimagable dielectric layer 120.

In one embodiment, the formation of the second dry film layer can further comprise laminating the second dry film layer on the patterned second photoimagable dielectric layer 120. In another embodiment, the second dry film resist layer may be deposited by any suitable mechanism including, but not limited to, physical vapor deposition, chemical vapor deposition, sputtering, metal paste deposition, combinations thereof, or the like.

In one embodiment, the various intermediate steps in generating the structure shown in the diagram 119 can include the second dry film resist layer being processed to pattern the second dry film resist layer. In one embodiment, processing the second dry film resist layer can further include exposing the second dry film resist layer using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not be limited to, approximately 436 nm, approximately 365 nm, approximately 248 nm, and approximately 193 nm. In one embodiment, there can be a one-to-one correspondence between the mask pattern and the dry film resist layer pattern, for example, using one-to-one mask aligners. In other embodiments, steppers and scanners with reduction optics can be used to project and shrink the pattern by four or five times onto the surface of the dry film resist layer. To achieve complete coverage, the dry film resist layer is repeatedly "stepped" from position to position under the optical column until full exposure is achieved.

In one embodiment, the various intermediate steps in generating the structure shown in the diagram 119 can include second pads 122 being formed in the patterned second dry film resist layer and the patterned second photoimagable dielectric layer 120 to produce a second structure 119. The forming of the pads 122 can further include electrolytic plating (also known as electroplating) pad metal layers 122 in the patterned second dry film resist layer and the patterned second photoimagable dielectric layers. In one embodiment, the electroplating can use electrodeposition, for example, using electric current to reduce dissolved metal cations so that they form a coherent metal coating in contact with the first pads 118.

The structure up till this point in fabrication can be immersed in a solution (called an electrolyte) containing one or more dissolved metal salts as well as other ions that permit the flow of electricity. A power supply can be used to supply a direct current to the anode, oxidizing the metal atoms that it comprises and allowing them to dissolve in the solution. At the first pads 118 (which can act as the cathode of the circuit), the dissolved metal ions in the electrolyte solution can be reduced at the interface between the solution and the first pads 118, such that they "plate out" onto the first pads 118. The rate at which the anode is dissolved is equal to the rate at which the cathode is plated, vis-a-vis the current through the circuit. In this manner, the ions in the electrolyte bath are continuously replenished by the anode.

In one embodiment, a first seed layer of metal (for example, a copper seed layer) may be first generated for the electroplating process. This seed layer may be deposited by sputter technology. In one embodiment, the first step may include wetting of the structure 119. During this process all trenches and vias (for example, those created in the patterning) can be filled with water without any bubbles remaining. This can be performed using detergents or by ultrasound systems.

The pads 122 can comprise copper, but also other metals can be plated. Non-limiting examples include gold, silver, aluminum, zinc, tin, platinum, and any of the like. Metallic materials may also be any alloys of such materials.

In one embodiment, the various intermediate steps in generating the structure shown in the diagram 119 can include the second dry resist layer being removed from the second structure 119. In one embodiment, removing the second dry resist layer can further include striping the dry film resist from the second structure 119.

Removing the dry resist layer can use a liquid resist stripper, which chemically alters the resist so that it no longer adheres to the underlying layers. The resist stripper can comprise organic materials specifically formulated to remove the dry resist layer. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the dry resist layer can further include etching the second structure. In another embodiment, the etching can include a flash etch. In one embodiment, the dry resist film can be etched with a piranha etch, including sulfuric acid and hydrogen peroxide. In one embodiment, the removal of the dry resist layer may be controlled approximately using the etching time and the known etch rate. In one embodiment, the etching entirely removes the dry resist layer of the structure, without damaging the underlying layers. This can be done in part based on the ratio of etch rates in the two materials (selectivity). In various embodiments, the etching can include an anisotropic etch that produces sharp, well-controlled features.

Figure 1J:
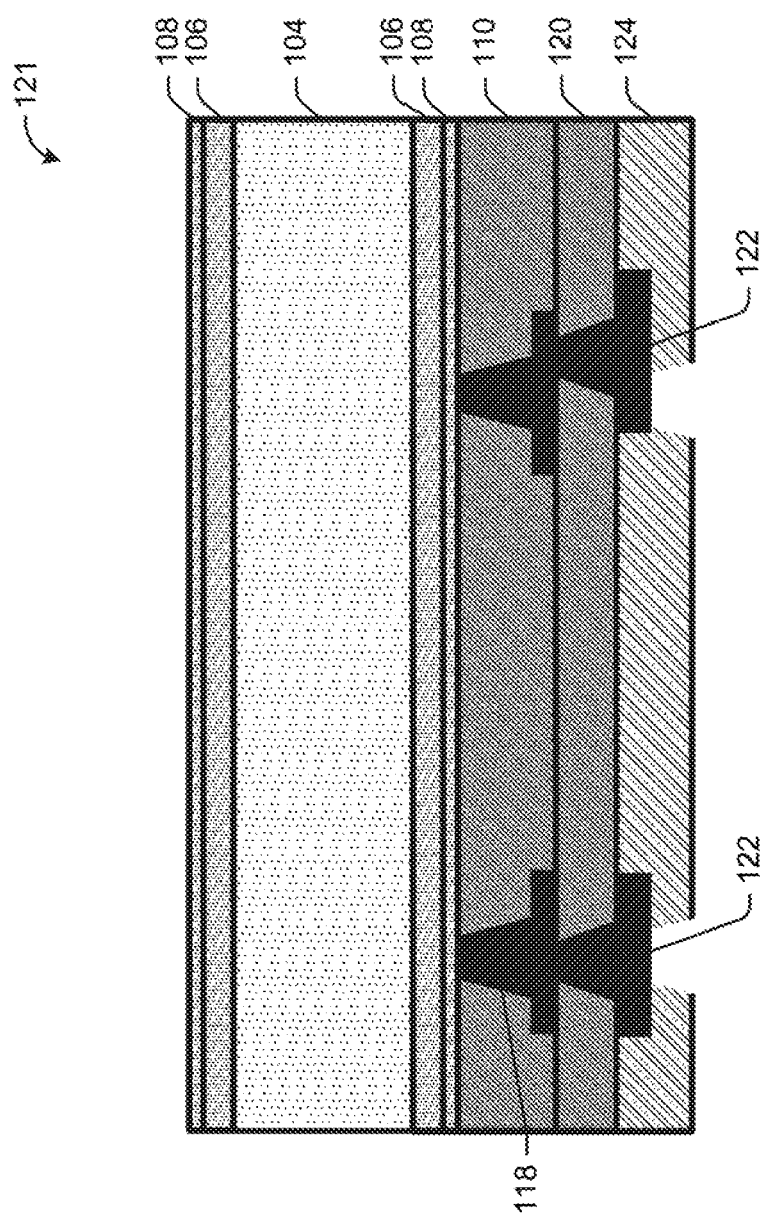

FIG. 1J shows a diagram 121 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, and the pads 118, a second photoimagable dielectric layer 120 on the treated first pad 118 and the patterned first photoimagable dielectric layer 110, additional pads 122 in the second photoimagable dielectric layer 120, and a first photoresist layer 124 that can be formed on the second pads 122 and the second patterned photoimagable dielectric layer 120.

In one embodiment, the formation of the first photoresist layer 124 further comprises laminating the first photoresist layer 124 on the second pads and the second patterned photoimagable dielectric layer 120. In another embodiment, the first photoresist layer 110 may be deposited by any suitable mechanism including, but not limited to, physical vapor deposition, chemical vapor deposition, sputtering, metal paste deposition, combinations thereof, or the like.

Further, processing of the first photoresist layer 124 can further include patterning the first photoresist layer 124. In one embodiment, processing the first photoresist layer 124 can further include exposing the first photoresist layer 124 using a mask. In one embodiment, processing the first photoresist layer 124 can further include developing the first photoresist layer 124 using an ultraviolet light source. The areas of the first photoresist layer 124, which are exposed, stay and the rest of the first photoresist layer 124 is developed. In one embodiment, processing the first photoresist layer 124 further comprises curing the first photoresist layer 124 using a heat source. The heat source can generate heat of a predetermined temperature of approximately 120 C to approximately 140 C, approximately 45 minutes.

Figure 1K:
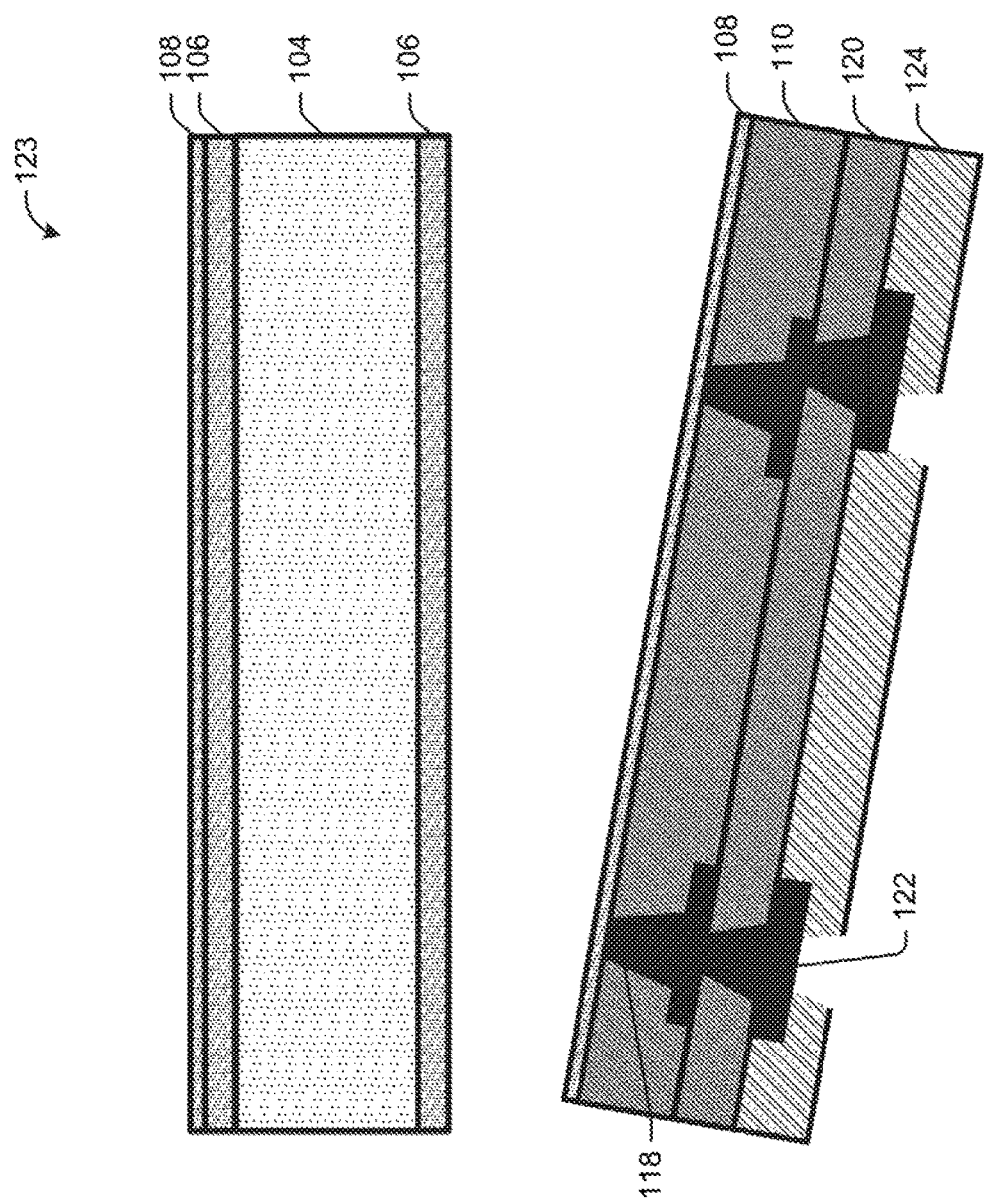

FIG. 1K shows a diagram 123 of the carrier 104, the first layers 102 and 106, the processed portion of the first layer 108, the patterned first photoimagable dielectric layer 110 on one of the treated first metal layers 108, the metal layer 114 on the patterned first photoimagable dielectric layer 110, and the pads 118, a second photoimagable dielectric layer 120 on the treated first pad 118 and the patterned first photoimagable dielectric layer 110, additional pads 122 in the second photoimagable dielectric layer 120, and a first photoresist layer 124, wherein the structure 121 (see FIG. 1J) can be removed from the carrier 104 comprising the first metal layer 106.

In one embodiment, removing the structure 121 (see FIG. 1J) can further include striping the structure 121 from the carrier comprising the first metal layer 106. Removing the structure 121 can use a liquid resist stripper, which chemically alters the second structure so that it no longer adheres to the underlying layers. The resist stripper can comprise organic materials specifically formulated to remove the second structure. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the structure 121 can further include etching the structure 121. In another embodiment, the etching can include a flash etch. In one embodiment, the structure 121 can be etched with a piranha etch, including sulfuric acid and hydrogen peroxide. In one embodiment, the removal of the structure 121 may be controlled approximately using the etching time and the known etch rate. In one embodiment, the etching entirely removes the structure 121, without damaging the underlying layers. This can be done in part based on the ratio of etch rates in the two materials (selectivity). In various embodiments, the etching can include an anisotropic etch that produces sharp, well-controlled features.

FIGS. 2A-2G shows diagrams of an example process flow of a photoimagable dielectric layer based Bumpless Laserless Embedded Substrate Structure (BLESS) architecture, in accordance with example embodiments of the disclosure.

Figure 2A:
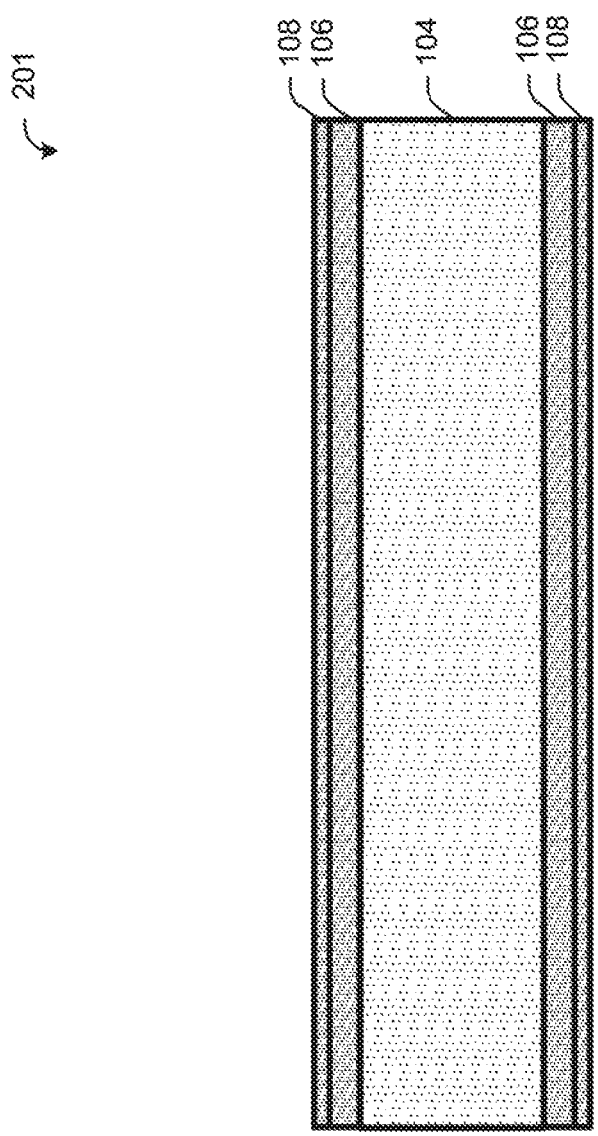
FIGS. 2A-2H show diagrams of another example process flow of a photoimagable dielectric layer based BLESS architecture, in accordance with example embodiments of the disclosure.

FIG. 2A shows a diagram 201 of a carrier 104 comprising of sacrificial material. Further first layers 106 can be formed on opposite sides of the carrier 104. In one embodiment, the layers 106 can comprise metal layers. The first layers 106 can include, but not be limited to, aluminum, silver, copper, and the like, and/or an alloy of aluminum, silver, copper, combinations thereof, or the like. The first layers 106 may be of any suitable thickness. In example embodiments, the first layers 106 may be any suitable thickness, for example, approximately 1 μm to approximately 1,000 μm thick, with a further example thickness of approximately 15 μm to approximately 30 μm thick.

In various embodiments, the layers 106 can comprise a metallic, semi-metallic, or intermetallic material. In various embodiments, the layers 102 and 106 can comprise a metallic material. Non-limiting examples include gold, copper, silver, aluminum, zinc, tin, platinum, and any of the like. Metallic materials may also be any alloys of such materials.

In various embodiments, the layers 102 and 106 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the layers 106 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers 102 and 106 can be deposited via sputtering, paste printing, squeegee, atomic layer deposition (ALD), or a variety of different physical vapor deposition (PVD) techniques. The layers 106 may be laminated on top of the carrier 104 by any suitable process, including, for example, cold roll or hot roll. In example embodiments, the layer 106 may be hot pressed on top of the carrier 104 at a predetermined temperature and pressure. Additionally the layer can be deposited via any of the above mentioned techniques (or others that are not explicitly named herein) and then picked and placed on the carrier 104, or laminated thereon, or positioned atop the carrier 104 via any other technique.

In another embodiment, second layers 108 can be formed on the opposite side of the carrier. In various embodiments, the first layers 106 can comprise a metallic, semi-metallic, or intermetallic material. In one embodiment, the second layer 108 can include, but not be limited to, aluminum, silver, copper, and the like, and/or an alloy of aluminum, silver, copper, combinations thereof, or the like. The second layer 108 can be the same material or different material as the first layer. The layer may be of any suitable thickness. In example embodiments, the layers 108 can be any suitable thickness, for example, approximately 1 μm to approximately 1,000 μm thick, with a further example thickness of approximately 15 μm to approximately 30 μm thick. The second layer can be of the same or different thickness as the first layer. The layer can be deposited via sputtering, paste printing, squeegee, atomic layer deposition (ALD), or a variety of different physical vapor deposition (PVD) techniques.

Further, the layers 108 can be processed to treat the surface of the layers 108 on both sides of the carrier. The processing can further include a copper roughening treatment of the layers 108, for example, to promote the adhesion of following layer depositions, for example, polymer and/or dielectric layers as described below.

Figure 2B:
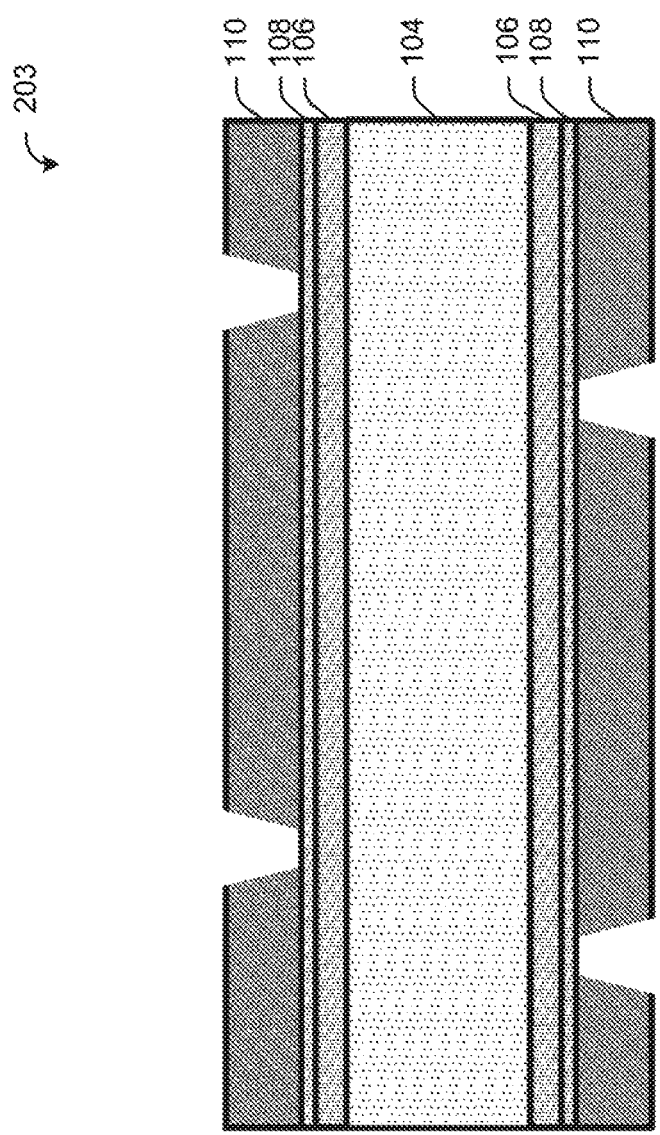

FIG. 2B shows a diagram 203 of a carrier 104 comprising of sacrificial material, first layers 106 formed on opposite sides of the carrier 104, second metal layers 108, and the photoimagable dielectric layers 110 which can be processed to pattern the first photoimagable dielectric layers 110 on both sides of the carrier 104. In various embodiments, the photoimagable dielectric layer 110 can be any suitable thickness, for example, approximately 1 μm to approximately 1,000 μm thick, with a further example thickness of approximately 1 μm to approximately 40 μm thick.

Figure 2C:
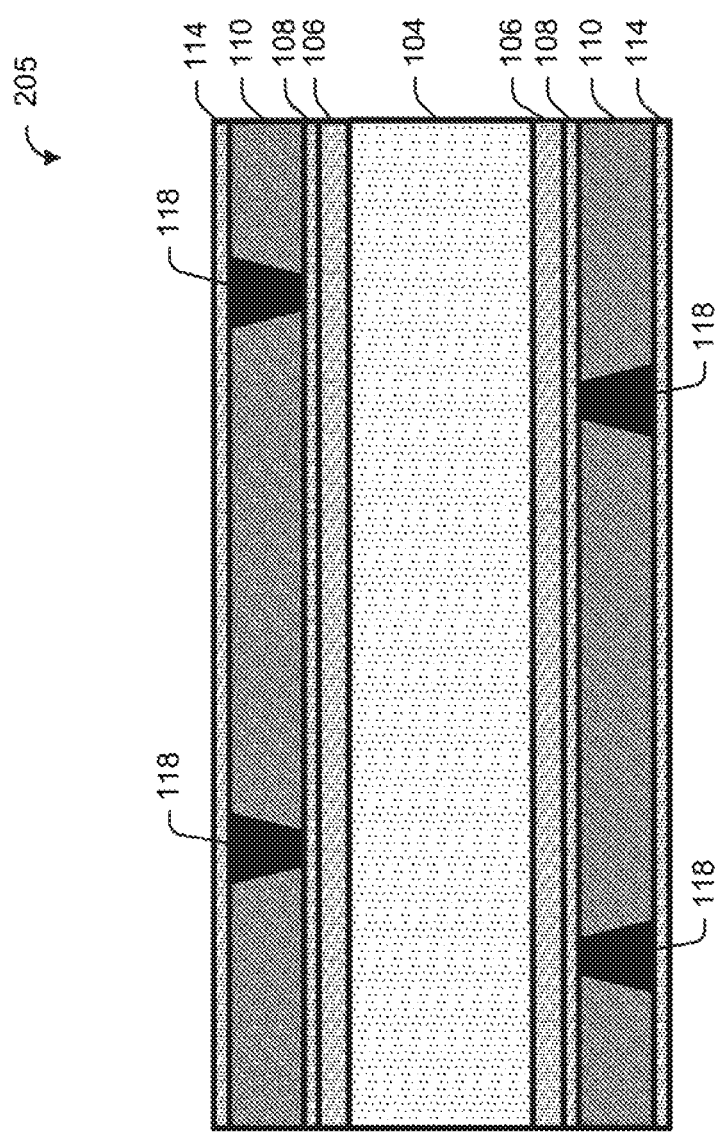

FIG. 2C shows a diagram 205 of a carrier 104, first layers 106, second metal layers 108, photoimagable dielectric layers 110, metal layer 114, and plated first pads 118 on both sides of the carrier 104. In one embodiment, the pads 118 can be made by electrodeless plating on patterned photoimagable dielectric layers 110. Alternatively or additionally, in various embodiments, a sputter seed process can be used for the formation of the metal layers 114. The sputtering process can be performed, for example, to increase the fine line spacing (FLS) of the semiconductor package. The sputter seed process can include sputtering of a Ti/Cu layer, or a Cu alloy layer.

In one embodiment, dry film resist layers (not shown) on the patterned photoimagable dielectric layers 110 can be formed on both sides of the carrier. In one embodiment, the formation of the dry film resist layers further comprises laminating the dry film layers on the patterned photoimagable dielectric layers 110. In another embodiment, the dry film resist layers may be deposited by any suitable mechanism. Further, in one embodiment, the dry film resist layers can be processed to pattern the first dry film resist layers on both sides of the carrier.

In one embodiment, the pads 118 can be formed in the patterned dry film resist layers and the patterned photoimagable dielectric layers 110 on both sides of the carrier to produce a first structure. The forming of the pads 118 can further include electrolytic plating pad metal layers 118 in the patterned dry film resist layers and the patterned photoimagable dielectric layers 110.

In one embodiment, the electroplating can use electrodeposition, for example, using electric current to reduce dissolved metal cations so that they form a coherent metal coating in contact with the metal layers. The structure up till this point in fabrication can be immersed in a solution (called an electrolyte) containing one or more dissolved metal salts as well as other ions that permit the flow of electricity.

In one embodiment, the dry resist layers can be removed from the structure on both sides of the carrier. In one embodiment, removing the dry resist layers can further include striping the dry film resist layers from the structure.

Figure 2D:
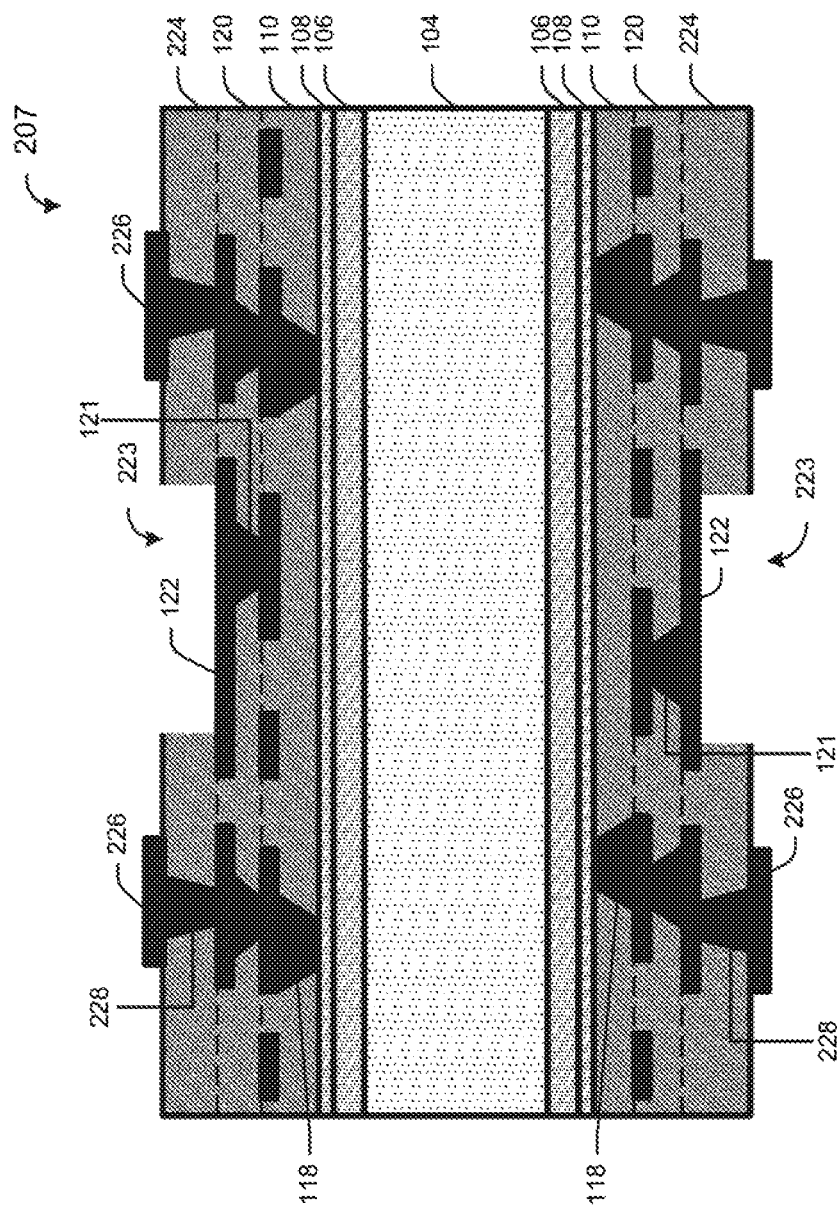

FIG. 2D shows a diagram 207 of the semiconductor package including the carrier 104, first layers 106, photoimagable dielectric layers 110, metal layer 114, plated first pads 118, and additional photoimagable dielectric layers 120 and 224 and pads 121 and 228 in addition to patterned metal layers 122 and 226. Further, FIG. 2D shows cavities 223 that can be formed by patterning the photoimagable dielectric layer 224.

The foregoing steps discussed above can be repeated to generate multiple photoimagable dielectric lamination layers (for example, 120 and 224) with embedded pads, including steps to laminate the photoimagable dielectric layers, expose the laminated photoimagable dielectric layers, develop the laminated photoimagable dielectric layers, cure the laminated photoimagable dielectric layers, plate the pads into the cured laminated photoimagable dielectric layer, and pattern the cured laminated photoimagable dielectric layers with the pads (for example, 121 and 228) embedded therein. Further, the structure can be exposed and developed accordingly to produce cavities and vias as shown in FIG. 2D.

Figure 2E:
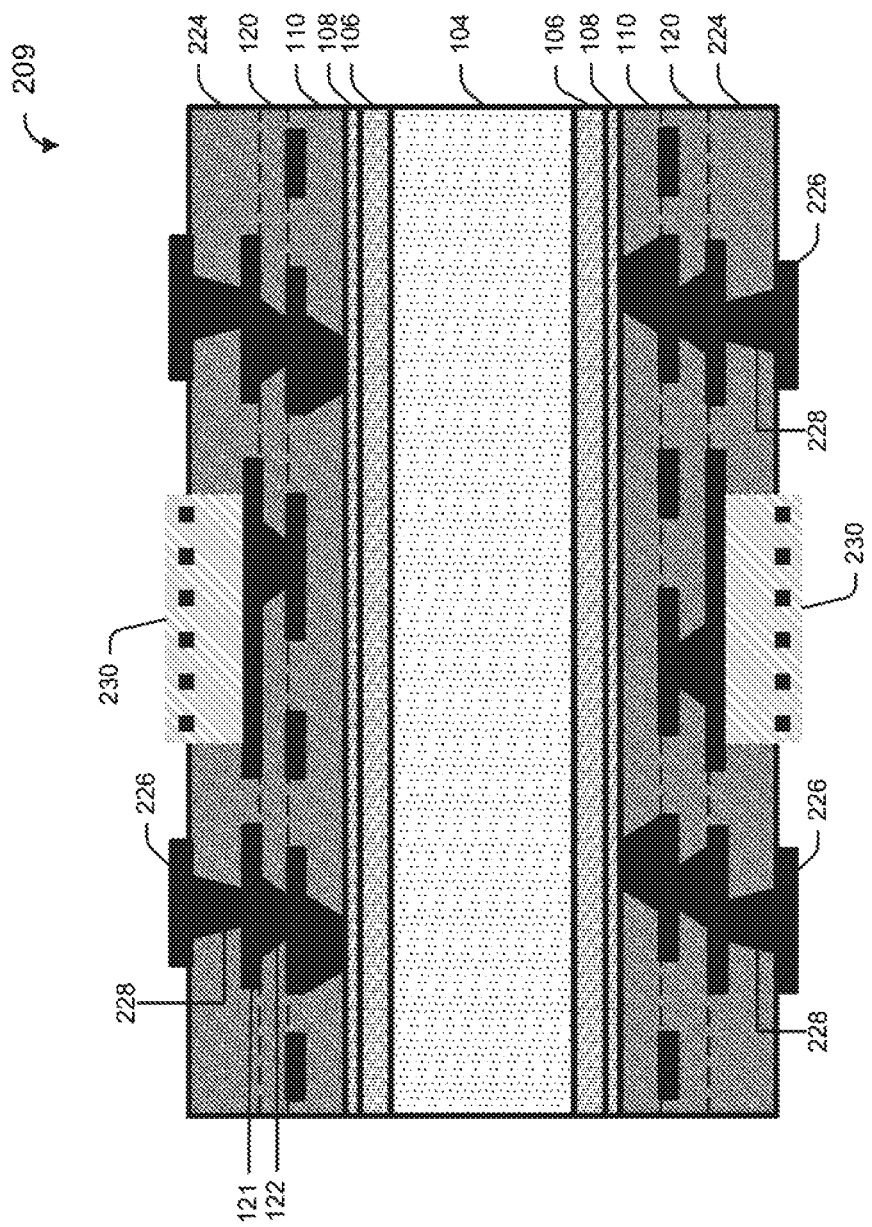

FIG. 2E shows a diagram 209 of the carrier 104, first layers 106, photoimagable dielectric layers 110, metal layer 114, plated first pads 118, and additional photoimagable dielectric layers 120 and 224, pads 121 and 228, patterned metal layers 122 and 226, and dies 230 that can be attached at corresponding cavities 223 (see FIG. 2D) on both sides of the carrier 104. In one embodiment, the dies 230 can be attached with a die bonding film (DFB) on both sides of the carrier.

Figure 2F:
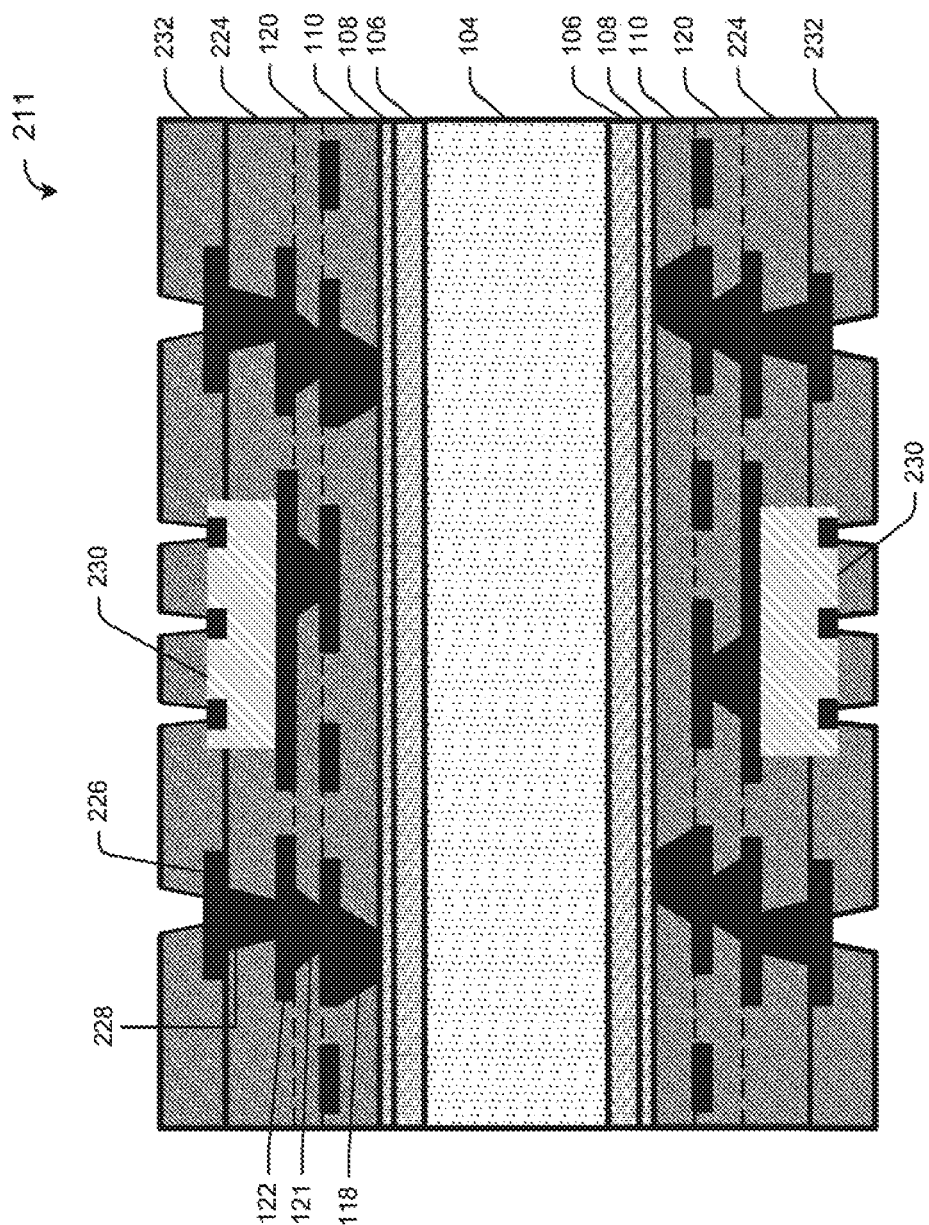

FIG. 2F shows a diagram 211 of the carrier 104, first layers 106, photoimagable dielectric layers 110, metal layer 114, plated first pads 118, and additional photoimagable dielectric layers 120 and 224, pads 121 and 228, patterned metal layers 122 and 226, the attached dies 230, and second patterned photoimagable dielectric layers 232 can be formed on both sides of the carrier. In one embodiment, the second photoimagable dielectric layers 232 can be laminated, exposed with lithographic techniques, developed, cured, and patterned.

Figure 2G:
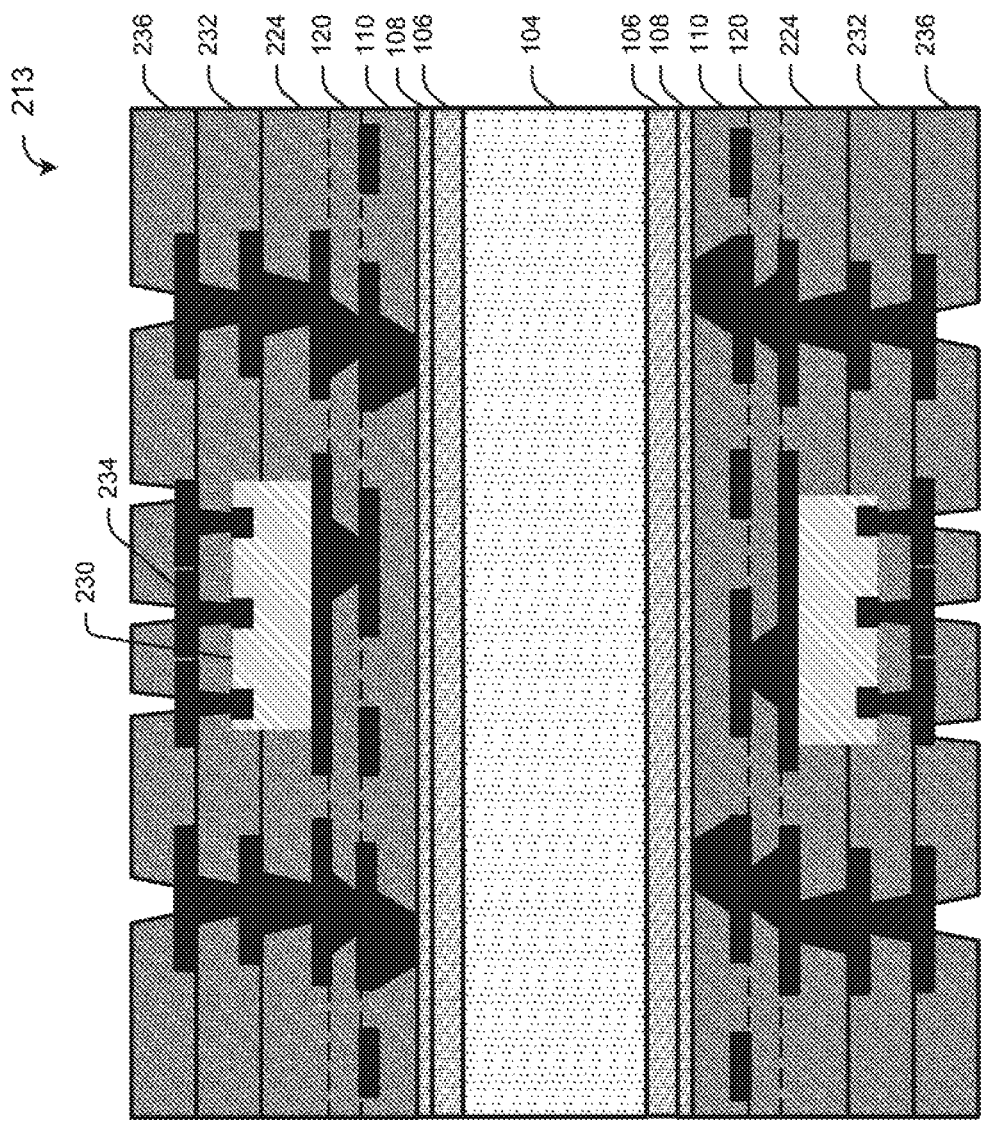

FIG. 2G shows a diagram 213 of the carrier 104, first layers 106, photoimagable dielectric layers 110, metal layer 114, plated first pads 118, and additional photoimagable dielectric layers 120 and 224, pads 121 and 228, patterned metal layers 122 and 226, dies 230, pads 234 on both sides of the carrier 104 that form a second structure. The forming of the pads 234 can further include electrolytic plating (also known as electroplating) pad metal layers in the patterned photoimagable dielectric layers. In one embodiment, the electroplating can use electrodeposition, for example, using electric current to reduce dissolved metal cations so that they form a coherent metal coating in contact with the underlying pads. Further, a patterned photoresist layers 236 can be formed top of the second photoimagable dielectric layers 232.

Figure 2H:
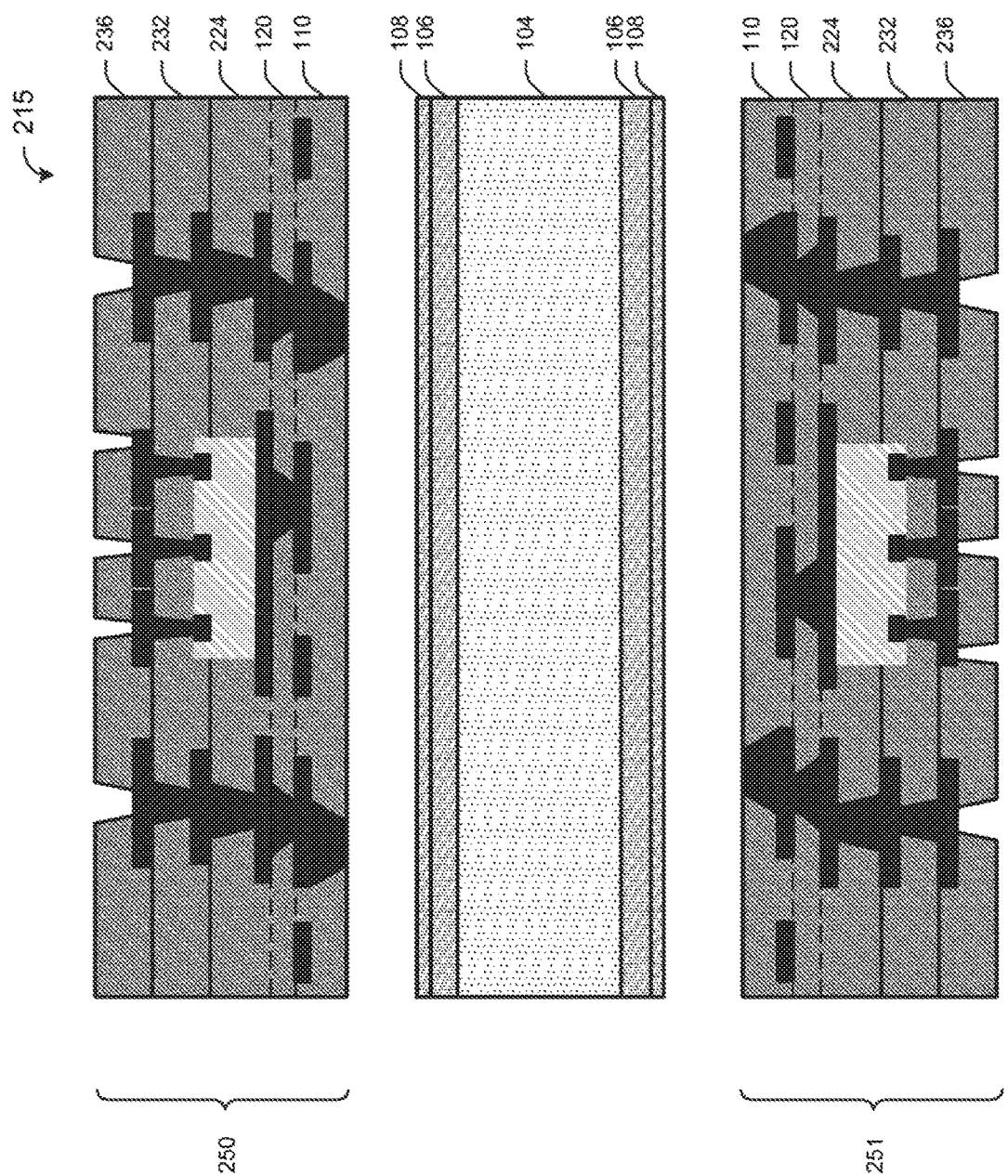

FIG. 2H shows a diagram 215 of the carrier 104, first layers 106, photoimagable dielectric layers 110, metal layer 114, plated first pads 118, and additional photoimagable dielectric layers 120 and 224, pads 121 and 228, patterned metal layers 122 and 226, dies 230, pads 234 on both sides of the carrier 104, and second photoimagable dielectric layers 232 that form a second structure. The forming of the pads 234 can further include electrolytic plating (also known as electroplating) pad metal layers in the patterned photoimagable dielectric layers. Further in FIG. 2H a first portion 250 and a second portion 251 of the structure of 213 of FIG. 2G has been removed. In one embodiment, removing the first 250 and second 251 portions can further include striping first and second portions from the structure.

Figure 3A:
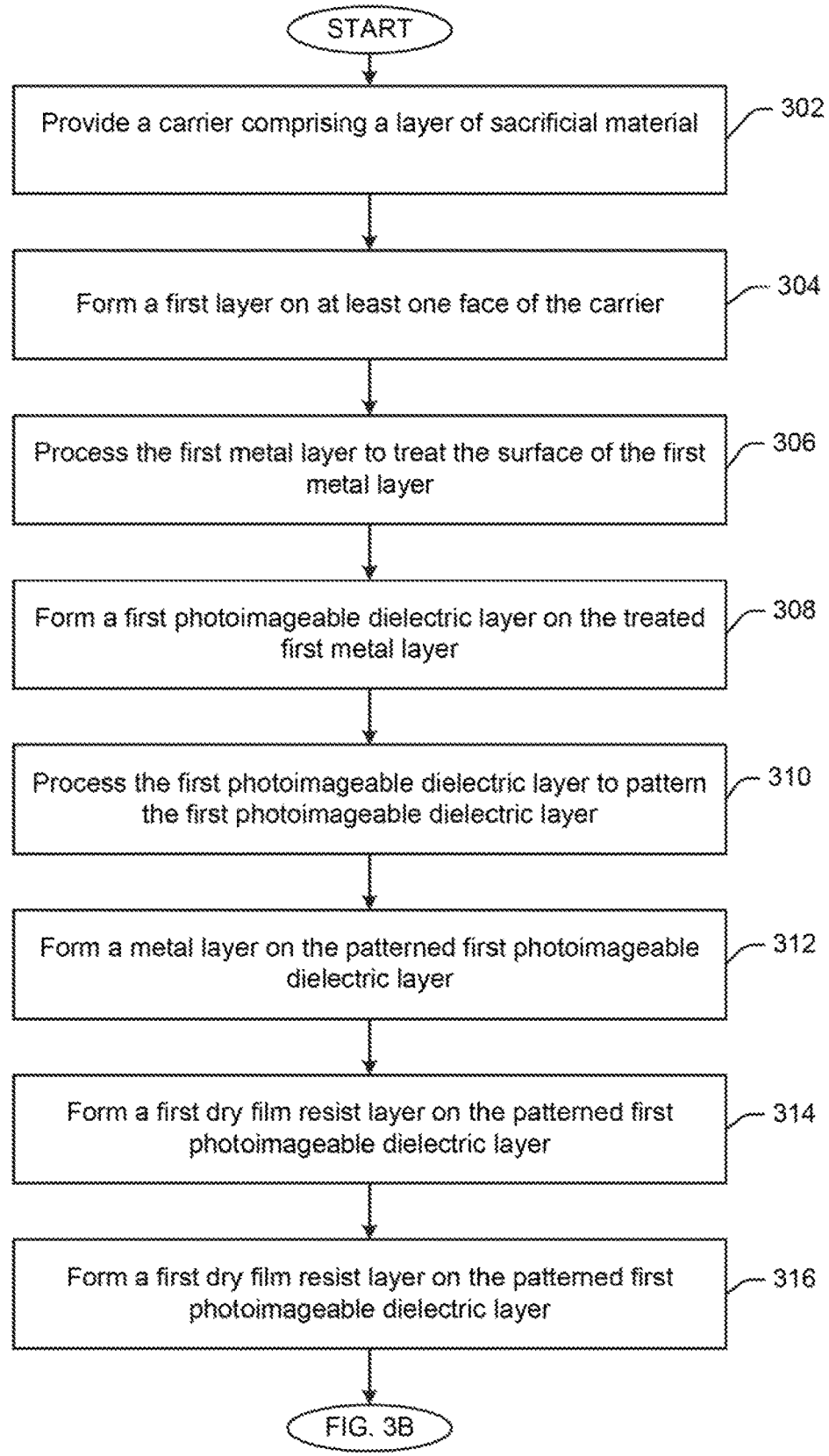
FIGS. 3A-3C show flowcharts of example operations for the fabrication of an example semiconductor package having a photoimagable dielectric layer based BLESS architecture, in accordance with example embodiments of the disclosure.
Figure 3B:
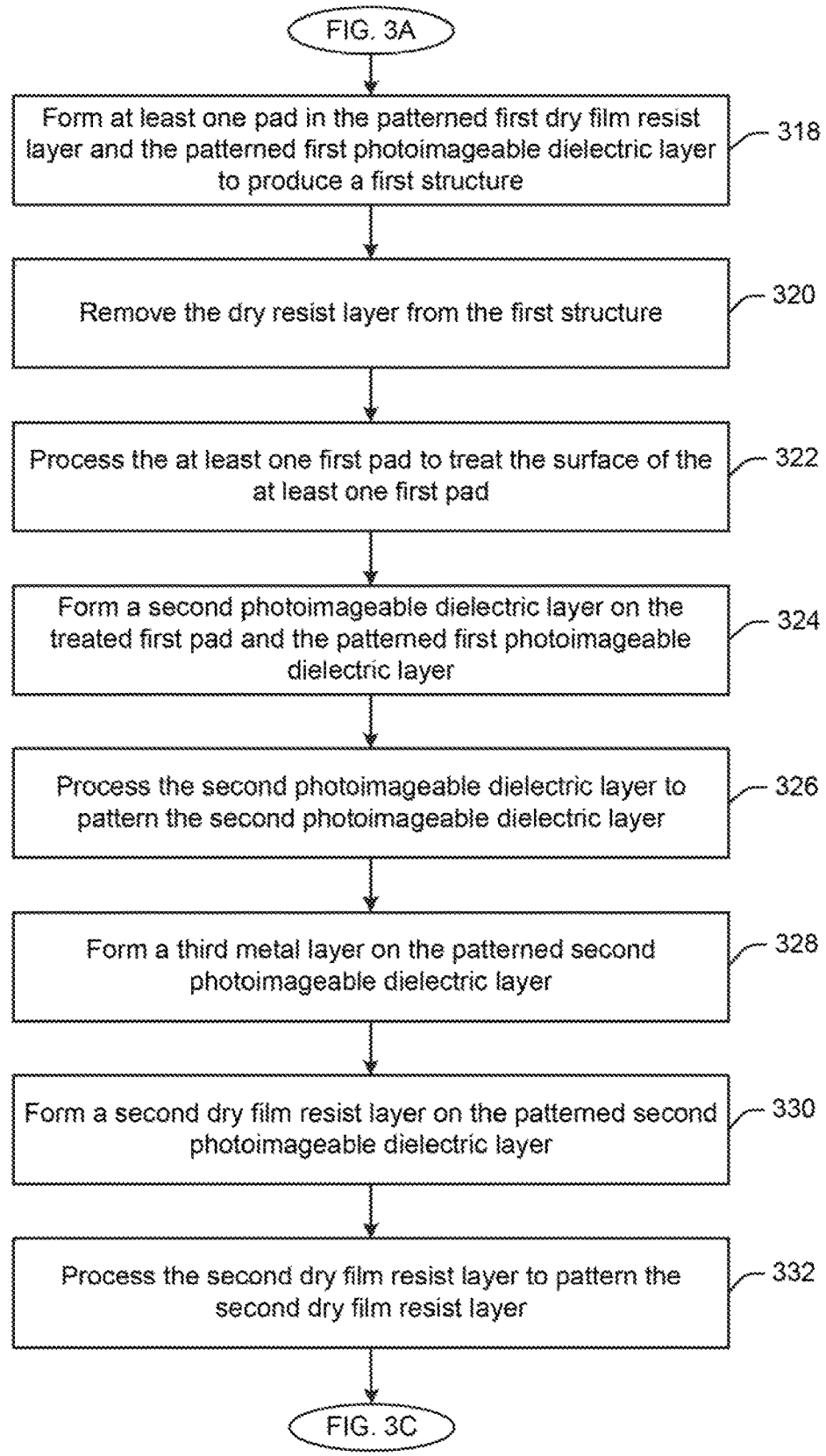
Figure 3C:
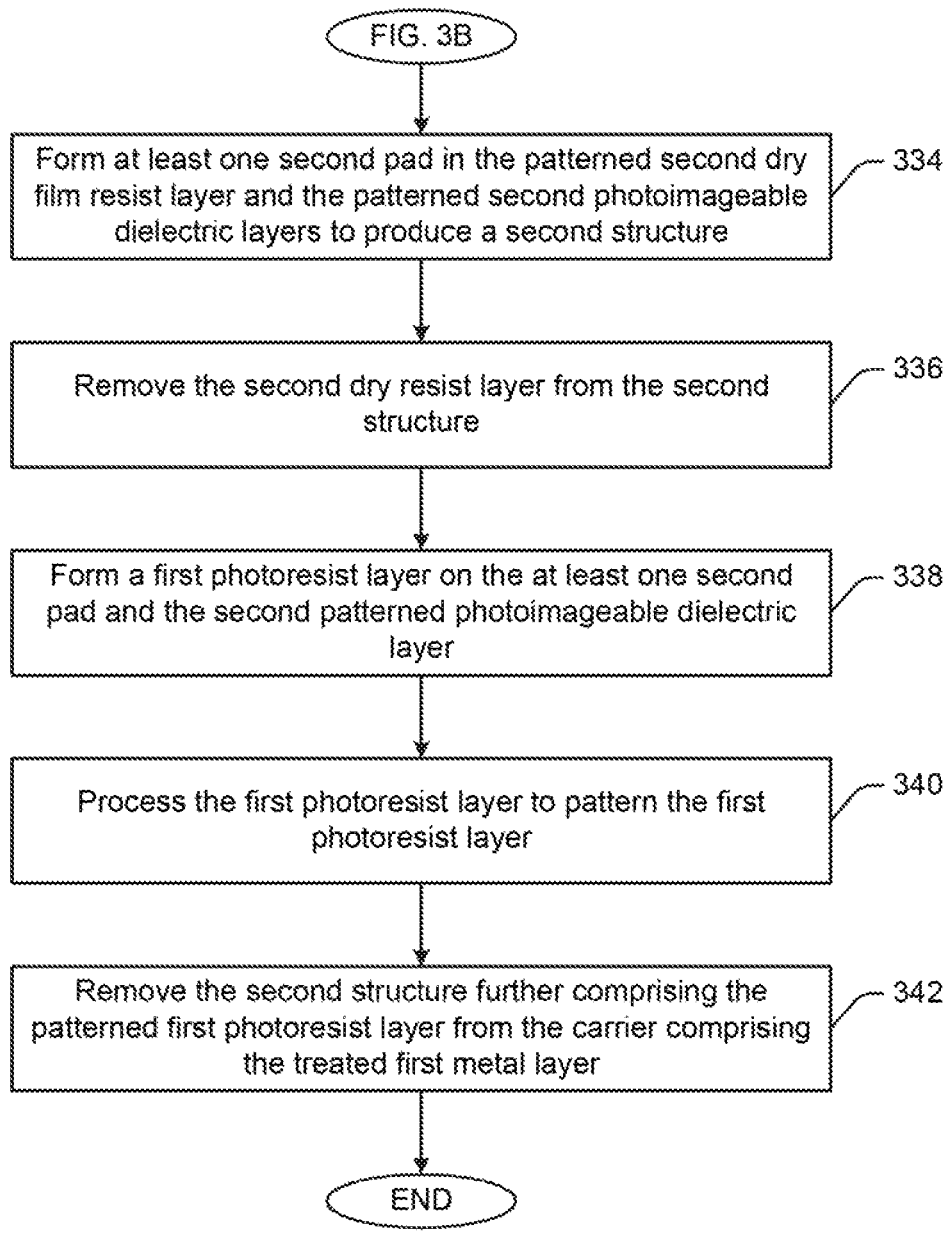

FIG. 3A-3C shows diagrams of an example flow chart for the fabrication flow related to various embodiments of the disclosure, for example, in the fabrication of the structures of FIG. 1. As such, reference will be made to the corresponding elements of FIG. 1 for ease of understanding, but should not be construed to be limited to the embodiments described in connection with FIG. 1.

In block 302, a carrier 104 comprising a layer of sacrificial material can be provided. The sacrificial material can include, but not be limited to, a thin slice of material such as silicon, silicon dioxide, aluminum oxide, sapphire, germanium, gallium arsenide (GaAs), an alloy of silicon and germanium, or indium phosphide (InP).

In block 304, first layers 102 and 106 on the carrier 104 can be formed. In one embodiment, the first layers 102 and 106 can comprise a first metal layer. The metal layer can include, but not be limited to, aluminum, silver, copper, and the like, and/or an alloy of aluminum, silver, copper, combinations thereof, or the like. The metal layer may be of any suitable thickness. In example embodiments, the first layers 102 and 106 can be any suitable thickness, for example, approximately 1 µm to approximately 1,000 µm thick, with a further example thickness of approximately 15 µm to approximately 30 µm thick.

In various embodiments, the first layers 102 and 106 can comprise a metallic, semi-metallic, or intermetallic material. In various embodiments, the first layers 102 and 106 can comprise a metallic material. Non-limiting examples include gold, copper, silver, aluminum, zinc, tin, platinum, and any of the like. Metallic materials may also be any alloys of such materials.

In various embodiments, the first layers 102 and 106 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the first layers 102 and 106 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers 102 and 106 can be deposited via sputtering, paste printing, squeegee, atomic layer deposition (ALD), or a variety of different physical vapor deposition (PVD) techniques. The layers 102 and 106 may be laminated on top of the carrier 104 by any suitable process, including, for example, cold roll or hot roll. In example embodiments, the layers 102 and 106 may be hot pressed on top of the carrier 104 at a predetermined temperature and pressure. Additionally the layer can be deposited via any of the above mentioned techniques (or others that are not explicitly named herein) and then picked and placed on the carrier 104, or laminated thereon, or positioned atop the carrier 104 via any other technique.

In block 306, the first metal layers 102 and 106 can be processed to treat the surface of the first metal layers 102 and 106. The processing can further include a copper roughening treatment of the first metal layers 102 and 106, for example, to promote the adhesion of following layer depositions, for example, polymer and/or dielectric layers as described below. The copper roughening treatment can include the application of a surface roughening agent, for example, an organic acid-type microetching solution, that creates a roughened surface of the metal layers 102 and 106. The roughened metal surface topography can help to achieve high metal-to-dry film, polymer and/or resin adhesion. In one embodiment, the metal roughening treatment can make the metal layers 102 and 106 have approximately a 0.1 µm to an approximately 5 µm average surface roughness, as measured, for example, by a surface profile measurement. In one embodiment, the surface roughness of the first metal layers 102 and 106 can be increased by applying the surface roughening treatment on the surface of the metal layers 102 and 106 for a longer period of time, for example, approximately 10 minutes versus approximately 20 minutes.

Alternatively or additionally, in another embodiment, the processing can further include an adhesion promoting treatment of the first metal layers 102 and 106. The adhesion promotion treatment can include a liquid or gaseous adhesion promoter, such as bis(trimethylsilyl)amine ("hexamethyldisilazane", HMDS), being applied to promote adhesion of the photoimagable dielectric layer (see below). The adhesion promotion treatment can be used to enhance the fine line space (FLS) of the semiconductor package. This FLS can lead to better routing, better form factor, and/or better substrate design parameters.

In block 308, a first photoimagable dielectric layer 110 on the treated first metal layer can be formed. In one embodiment, the formation of the first photoimagable dielectric layer 110 further comprises laminating the first photoimagable dielectric layer 110 on the treated first metal layer 108. In another embodiment, the first photoimagable dielectric layer 110 may be deposited by any suitable mechanism including, but not limited to, physical vapor deposition, chemical vapor deposition, sputtering, metal paste deposition, combinations thereof, or the like.

In one embodiment, the light types that can be used to image the photoimagable dielectric layer 110 can include, but not be limited to, UV, DUV (Deep UV), and the g and I lines having wavelength of approximately 436 nm and approximately 365 nm, respectively, of a mercury-vapor lamp. In one embodiment, the developing light wavelength parameter can be related to the thickness of the applied photoimagable dielectric layer 110, with thinner layers corresponding to shorter wavelengths. This can permit a reduced aspect ratio and a reduced minimum feature size.

In one embodiment, various chemicals may be used for permanently giving the photoimagable dielectric layer 110 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, the photoimagable dielectric layer 110 can include a dry film. The dry film can stand alone amongst the other types in that the coating already exists as a uniform thickness, semi-solid film coated onto a polyester substrate and the user applies that substrate to the treated first metal layer 108 by lamination.

In block 310, the first photoimagable dielectric layer 110 can be processed to pattern the first photoimagable dielectric layer 110. In one embodiment, processing the first photoimagable dielectric layer 110 can further include exposing the first photoimagable dielectric layer 110 using a mask 112. The mask can include, for example, a photomask 112, which can refer to an opaque plate with holes or transparencies that allow light to shine through in a defined pattern. In one embodiment, the photomask 112 can include transparent fused silica blanks covered with a pattern defined with a chrome metal-absorbing film. In another embodiment, the photomask 112 can be used at a predetermined wavelength, including, but not be limited to, approximately 436 nm, approximately 365 nm, approximately 248 nm, and approximately 193 nm. In one embodiment, there can be a one-to-one correspondence between the mask pattern and the photoimagable dielectric layer pattern, for example, using one-to-one mask aligners. In other embodiments, steppers and scanners with reduction optics can be used to project and shrink the pattern by four or five times onto the surface of the photoimagable dielectric layer 110. To achieve complete coverage, the photoimagable dielectric layer is repeatedly "stepped" from position to position under the optical column until full exposure is achieved.

In one embodiment, processing the first photoimagable dielectric layer 110 can further include developing the first photoimagable dielectric layer 110 using an ultraviolet light source. In one embodiment, the light types that can be used to image the photoimagable dielectric layer 110 can include, but not be limited to, UV, DUV (Deep UV), and the g and I lines having wavelength of approximately 436 nm and approximately 365 nm respectively of a mercury-vapor lamp. In various embodiments, the development of the first photoimagable dielectric layer 110 can include an exposure to the ultraviolet light source for a few seconds through the mask. The areas of the first photoimagable dielectric layer 110, which are exposed, stay and the rest of the first photoimagable dielectric layer 110 is developed.

In one embodiment, the developing light wavelength parameter can be related to the thickness of the applied photoimagable dielectric layer 110, with thinner layers corresponding to shorter wavelengths. This can permit a reduced aspect ratio and a reduced minimum feature size.

In one embodiment, various chemicals may be used for permanently giving the photoimagable dielectric layer 110 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the first photoimagable dielectric layer 110 further comprises curing the first photoimagable dielectric layer 110 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In block 312, a metal layer 114 on the patterned first photoimagable dielectric layer 110 can be formed. In one embodiment, the forming the metal layer 114 can further include electrodeless plating the metal layer 114 on the patterned first photoimagable dielectric layer 110. Electroless plating, also known as chemical or auto-catalytic plating, can refer to a non-galvanic plating method that involves several simultaneous reactions in an aqueous solution, which occur without the use of external electrical power. The solution for the electroless process may need to contain a reducing agent. Electroless plating can use a redox reaction to deposit metal on an object without the passage of an electric current. Because it allows a constant metal ion concentration to bathe all parts of the object, it can deposit metal evenly along edges, inside holes, and over irregularly shaped objects, which are difficult to plate evenly with electroplating.

In one embodiment, the metal layer 114 can include a copper layer. The formation of the metal layer can be done at least in part by a wet process and/or a sputter type process. Copper can be plated by reducing complexed copper with formaldehyde in alkaline solution. The reaction can be catalyzed by palladium.

Alternatively or additionally, in various embodiments, a sputter seed process can be used for the formation of the metal layer 114. The sputtering process can be performed, for example, to increase the fine line spacing (FLS) of the semiconductor package. The sputter seed process can include sputtering of a Ti/Cu layer, or a Cu alloy layer. The sputtering can be, for example, a radio-frequency (RF) sputtering deposition, an ion-beam sputtering deposition, a reactive sputtering deposition, ion-assisted sputtering deposition, high-target-utilization sputtering deposition, and/or Gas flow sputtering deposition.

In block 314, a first dry film resist layer 116 on the patterned first photoimagable dielectric layer 110 can be formed. In one embodiment, the formation of the first dry film layer 116 further comprises laminating the first dry film layer 116 on the patterned first photoimagable dielectric layer 110. In another embodiment, the first dry film resist layer 116 may be deposited by any suitable mechanism including, but not limited to, physical vapor deposition, chemical vapor deposition, sputtering, metal paste deposition, combinations thereof, or the like.

In various embodiments, a laminator roll temperature of approximately 100° C. to approximately 115° C. (approximately 212-approximately 239° F.) can be used to form the dry film layer; a speed in units of m/min (equivalently ft/min) of approximately 2.0 m/min with a tolerance of approximately 1.0 m/min (equivalently, approximately 6.5 ft/min with a tolerance of approximately 3.3 ft/min) can be used to form the dry film layer; a pressure in units of kg/cm$^2$ (or equivalently in PSI) of approximately 2.5 kg/cm$^2$ with a tolerance of approximately 1.5 kg/cm$^2$ (equivalently, approximately 40 PSI with a tolerance of approximately 20 PSI) can be used to form the dry film layer.

In block 316, the first dry film resist layer 116 can be processed to pattern the first dry film resist layer 116. In various embodiments, the processing of the dry film resist layer 116 can be performed using various tools including, but not limited to, a negative developer, an exposure kit, transparency film, and a foam brush, a laminator, a cutting device (for example, a sharp scissors or fabric cutter), and/or a safelight (for example, a working area lit by a yellow or red 40 watt incandescent bulb).

The formation of the first dry film resist layer 116 can further include, generally, creating a safelight environment, the application of the dry film resist, exposure of the dry film resist, development of the dry film resist, and stripping (after use) of the dry film resist.

In an embodiment, the dry film resist layer 116 can be exposed by ambient light, so a dimly lit work area may be used. A darkroom lit by a red or yellow 40 watt incandescent bulb may be optimal. For the laminator, the following parameters may be used: a seal bar temperature of approximately 50° C. to approximately 80° C. (approximately 120° F. to approximately 176° F.)

In one embodiment, processing the first dry film resist layer 116 can further include exposing the first dry film resist layer 116 using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not be limited to, approximately 436 nm, approximately 365 nm, approximately 248 nm, and approximately 193 nm. In one embodiment, there can be a one-to-one correspondence between the mask pattern and the dry film resist layer 116 pattern, for example, using one-to-one mask aligners. In other embodiments, steppers and scanners with reduction optics can be used to project and shrink the pattern by four or five times onto the surface of the dry film resist layer 116. To achieve complete coverage, the dry film resist layer 116 is repeatedly "stepped" from position to position under the optical column until full exposure is achieved.

In one embodiment, processing the first dry film resist layer 116 can further include developing the first dry film resist layer 116 using an ultraviolet light source. In one embodiment, the light types that can be used to image the photoimagable dielectric layer 110 can include, but not be limited to, UV, DUV (Deep UV), and the g and I lines having wavelength of approximately 436 nm and approximately 365 nm respectively of a mercury-vapor lamp. In various embodiments, the development of the first dry film resist layer 116 can include an exposure to the ultraviolet light source for a few seconds through the mask. The areas of the first dry film resist layer which are exposed stay, and the rest of the first dry film resist layer is developed. In one embodiment, the developing light wavelength parameter can be related to the thickness of the applied dry film resist layer 116, with thinner layers corresponding to shorter wavelengths. This can permit a reduced aspect ratio and a reduced minimum feature size.

In one embodiment, various chemicals may be used for permanently giving the dry film resist layer 116 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the first dry film resist layer 116 further comprises curing the first dry film resist layer 116 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using high-efficiency particulate arrestance (HEPA) filtration of the air inside the oven. In one embodiment, the HEPA filter use can include a HEPA filter to produce Class 10 (International Organization for Standardization (ISO) Class 4) air quality. Moreover, the oven can be configured to have low oxygen levels to prevent oxidation of any of the layers.

In block 318, pads 118 can be formed in the patterned first dry film resist layer 116 and the patterned first photoimagable dielectric layer 110 to produce a first structure 115. The forming of the pads 118 can further include electrolytic plating (also known as electroplating) pad metal layers 118 in the patterned first dry film resist layer 116 and the patterned first photoimagable dielectric layers 110. In one embodiment, the electroplating can use electrodeposition, for example, using electric current to reduce dissolved metal cations so that they form a coherent metal coating in contact with the first metal layer 108.

The structure up till this point in fabrication can be immersed in a solution (called an electrolyte) containing one or more dissolved metal salts as well as other ions that permit the flow of electricity. A power supply can be used to supply a direct current to the anode, oxidizing the metal atoms that it comprises and allowing them to dissolve in the solution. At the first metal layer 108 (which can act as the cathode of the circuit), the dissolved metal ions in the electrolyte solution can be reduced at the interface between the solution and the first metal layer 108, such that they "plate out" onto the first metal layer 108. The rate at which the anode is dissolved is equal to the rate at which the cathode is plated, vis-a-vis the current through the circuit. In this manner, the ions in the electrolyte bath are continuously replenished by the anode.

In one embodiment, a first a seed layer of metal (for example, a copper seed layer) may be first generated for the electroplating process. This seed layer may be deposited by sputter technology. In one embodiment, the first step may include wetting of the structure 115. During this process all trenches and vias (for example, those created in the patterning) can be filled with water without any bubbles remaining. This can be performed using detergents or by ultrasound systems. The structure 115 can then be flooded with electrolyte or sprayed by a rotating set of nozzles. This process may require temperature control. The metal ions can thereby be discharged and deposited on the seed layer, which can act as the cathode. Finally, the structure 115 may need to be cleaned and dried (for example, using an oven).

In various embodiments, the pads 118 can comprise copper, but also other metals can be plated. Non-limiting examples include gold, silver, aluminum, zinc, tin, platinum, and any of the like. Metallic materials may also be any alloys of such materials.

In block 320, the dry resist layer 116 can be removed from the first structure 115. In one embodiment, removing the dry resist layer 116 can further include striping the dry film resist layer 116 from the first structure 115. Removing the dry resist layer 116 can use a liquid resist stripper, which chemically alters the resist so that it no longer adheres to the underlying layers. The resist stripper can comprise organic materials specifically formulated to remove the dry resist layer. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the dry resist layer 116 can further include etching the first structure 115. In another embodiment, the etching can include a flash etch. In one embodiment, the dry resist film 116 can be etched with a piranha etch, including sulfuric acid and hydrogen peroxide. In one embodiment, the removal of the dry resist layer 116 may be controlled approximately using the etching time and the known etch rate. In one embodiment, the etching entirely removes the dry resist layer of the structure 115, without damaging the underlying layers. This can be done in part based on the ratio of etch rates in the two materials (selectivity). In various embodiments, the etching can include an anisotropic etch that produces sharp, well-controlled features.

In block 322, the first pads 118 can be processed to treat the surface of the first pads 118. The processing can further include a copper roughening treatment of the first pads 118 for example, to promote the adhesion of the following layers, e.g., a polymer layer. The copper roughening treatment can include the application of a surface roughening agent, for example, an organic acid-type microetching solution, that creates a roughened surface of the first pad 118. The roughened metal surface topography can help to achieve high metal-to-dry film, polymer and/or resin adhesion. In one embodiment, the metal roughening treatment can make the first pad 118 have approximately a 0.1 micrometers (μm) to an approximately 5 μm average surface roughness, as measured, for example, by a surface profile measurement. In one embodiment, the surface roughness of the first pad 118 can be increased by applying the surface roughening treatment on the surface of the first pad 118 for a longer period of time, for example, approximately 10 minutes versus approximately 20 minutes.

In another embodiment, the processing can further include an adhesion promoting treatment of the first pad 118. The adhesion promotion treatment can include a liquid or gaseous adhesion promoter, such as Bis(trimethylsilyl)amine ("hexamethyldisilazane", HMDS), being applied to promote adhesion of the photoimagable dielectric layer 110.

In block 324, a second photoimagable dielectric layer 120 can be formed on the treated first pad 118 and the patterned first photoimagable dielectric layer 110. In one embodiment, the formation of the second photoimagable dielectric layer 120 further comprises laminating the second photoimagable dielectric layer 120 on the treated first pad 118 and the patterned first photoimagable dielectric layer 110. In another embodiment, the second photoimagable dielectric layer 120 may be deposited by any suitable mechanism including, but not limited to, physical vapor deposition, chemical vapor deposition, sputtering, metal paste deposition, combinations thereof, or the like.

In one embodiment, the light types that can be used to image the photoimagable dielectric layer 120 can include, but not be limited to, UV, DUV (Deep UV), and the g and I lines having wavelength of approximately 436 nm and approximately 365 nm, respectively, of a mercury-vapor lamp. In one embodiment, the developing light wavelength parameter can be related to the thickness of the photoimagable dielectric layer 120, with thinner layers corresponding to shorter wavelengths. This can permit a reduced aspect ratio and a reduced minimum feature size.

In one embodiment, various chemicals may be used for permanently giving the photoimagable dielectric layer 120 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, the photoimagable dielectric layer 120 can include a dry film. The dry film can stand alone amongst the other types in that the coating already exists as a uniform thickness, semi-solid film coated onto a polyester substrate and the user applies that substrate to the treated first pad 118 and the patterned first photoimagable dielectric layer 110 by lamination.

In block 326, the second photoimagable dielectric layer 120 can be processed to pattern the second photoimagable dielectric layer 120. In one embodiment, processing the second photoimagable dielectric layer 120 can further include exposing the second photoimagable dielectric layer 120 using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including, but not be limited to, approximately 436 nm, approximately 365 nm, approximately 248 nm, and approximately 193 nm. In one embodiment, there can be a one-to-one correspondence between the mask pattern and the photoimagable dielectric layer pattern, for example, using one-to-one mask aligners. In other embodiments, steppers and scanners with reduction optics can be used to project and shrink the pattern by four or five times onto the surface of the photoimagable dielectric layer 120. To achieve complete coverage, the photoimagable dielectric layer can be repeatedly "stepped" from position to position under the optical column until full exposure is achieved.

In one embodiment, processing the second photoimagable dielectric layer 120 can further include developing the second photoimagable dielectric layer 120 using an ultraviolet light source. In one embodiment, the light types that can be used to image the photoimagable dielectric layer 120 can include, but not be limited to, UV, DUV (Deep UV), and the g and I lines having wavelength of approximately 436 nm and approximately 365 nm respectively of a mercury-vapor lamp. In various embodiments, the development of the second photoimagable dielectric layer 120 can include an exposure to the ultraviolet light source for a few seconds through the mask. The areas of the second photoimagable dielectric layer 120, which are exposed, stay and the rest of the second photoimagable dielectric layer 120 is developed. In one embodiment, the developing light wavelength parameter can be related to the thickness of the photoimagable dielectric layer 120, with thinner layers corresponding to shorter wavelengths. This can permit a reduced aspect ratio and a reduced minimum feature size.

In one embodiment, various chemicals may be used for permanently giving the photoimagable dielectric layer 120 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the second photoimagable dielectric layer 120 further comprises curing the second photoimagable dielectric layer 120 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In block 328, a third metal layer (not shown) can be formed on the patterned second photoimagable dielectric layer 120. In one embodiment, the forming the third metal layer can further include electrodeless plating the third metal layer on the patterned second photoimagable dielectric layer 120. Electroless plating, also known as chemical or auto-catalytic plating, can refer to a non-galvanic plating method that involves several simultaneous reactions in an aqueous solution, which occur without the use of external electrical power. The solution for the electroless process may need to contain a reducing agent.

In block 330, a second dry film resist layer (not shown) can be formed on the patterned second photoimagable dielectric layer 120. In one embodiment, the formation of the second dry film resist layer further comprises laminating the second dry resist film layer on the patterned second photoimagable dielectric layer 120. In another embodiment, the second dry film resist layer may be deposited by any suitable mechanism including, but not limited to, physical vapor deposition, chemical vapor deposition, sputtering, metal paste deposition, combinations thereof, or the like.

In various embodiments, a laminator roll temperature of approximately 100° C. to approximately 115° C. (approximately 212° F. to approximately 239° F.) can be used to form the dry film layer; a speed in units of m/min (equivalently ft/min) of approximately 2.0 m/min with a tolerance of approximately 1.0 m/min (equivalently, approximately 6.5 ft/min with a tolerance of approximately 3.3 ft/min) can be used to form the dry film layer; a pressure in units of kg/cm$^2$ (or equivalently in PSI) of approximately 2.5 kg/cm$^2$ with a tolerance of approximately 1.5 kg/cm$^2$ (equivalently, approximately 40 PSI with a tolerance of approximately 20 PSI) can be used to form the dry film layer.

In block 332, the second dry film resist layer (not shown) can be processed to pattern the second dry film resist layer. In one embodiment, processing the second dry film resist layer can further include exposing the second dry film resist layer using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not be limited to, approximately 436 nm, approximately 365 nm, approximately 248 nm, and approximately 193 nm. In one embodiment, there can be a one-to-one correspondence between the mask pattern and the dry film resist layer pattern, for example, using one-to-one mask aligners. In other embodiments, steppers and scanners with reduction optics can be used to project and shrink the pattern by four or five times onto the surface of the dry film resist layer. To achieve complete coverage, the dry film resist layer is repeatedly "stepped" from position to position under the optical column until full exposure is achieved.

In one embodiment, processing the second dry film resist layer can further include developing the second dry film resist layer using an ultraviolet light source. In one embodiment, the light types that can be used to image the photoimagable dielectric layer 120 can include, but not be limited to, UV, DUV (Deep UV), and the g and I lines having wavelength of approximately 436 nm and approximately 365 nm respectively of a mercury-vapor lamp. In various embodiments, the development of the second dry film resist layer can include an exposure to the ultraviolet light source for a few seconds through the mask. The areas of the second dry film resist layer, which are exposed, stay and the rest of the second dry film resist layer is developed.

In one embodiment, the developing light wavelength parameter can be related to the thickness of the applied dry film resist layer, with thinner layers corresponding to shorter wavelengths. This can permit a reduced aspect ratio and a reduced minimum feature size.

In one embodiment, various chemicals may be used for permanently giving the dry film resist layer the desired property variations. The chemicals can include, but not be limited to, poly(methyl methacrylate) (PMMA), poly(m-ethyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the second dry film resist layer further comprises curing the second dry film resist layer using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can include a HEPA filter to produce Class 10 (ISO Class 4) air quality. Moreover, the oven can be configured to have low oxygen levels to prevent oxidation of any of the layers.

In block 334, at least one second pad 122 can be formed in the patterned second dry film resist layer and the patterned second photoimagable dielectric layers to produce a structure 119.

The forming of the pads 122 can further include electrolytic plating (also known as electroplating) pad metal layers in the patterned second dry film resist layer and the patterned second photoimagable dielectric layers 120.

In one embodiment, the electroplating can use electrodeposition, for example, using electric current to reduce dissolved metal cations so that they form a coherent metal coating in contact with the first pad 118.

The structure up till this point in fabrication can be immersed in a solution (called an electrolyte) containing one or more dissolved metal salts as well as other ions that permit the flow of electricity. A power supply can be used to supply a direct current to the anode, oxidizing the metal atoms that it comprises and allowing them to dissolve in the solution. At the first pad 118 (which can act as the cathode of the circuit), the dissolved metal ions in the electrolyte solution can be reduced at the interface between the solution and the first pad 118, such that they "plate out" onto the first pad 118. The rate at which the anode is dissolved is equal to the rate at which the cathode is plated, vis-a-vis the current through the circuit. In this manner, the ions in the electrolyte bath are continuously replenished by the anode.

In one embodiment, a first a seed layer of metal (for example, a copper seed layer) may be first generated for the electroplating process. This seed layer may be deposited by sputter technology. In one embodiment, the first step may include wetting of the structure 119. During this process all trenches and vias (for example, those created in the patterning) can be filled with water without any bubbles remaining. This can be performed using detergents or by ultrasound systems.

The structure 119 can then be flooded with electrolyte or sprayed by a rotating set of nozzles. This process may require temperature control. The metal ions can thereby be discharged and deposited on the seed layer, which can act as the cathode. Finally the structure 119 may need to be cleaned and dried (for example, using an oven).

The pads 122 can comprise copper, but also other metals can be plated. Non-limiting examples include gold, silver, aluminum, zinc, tin, platinum, and any of the like. Metallic materials may also be any alloys of such materials.

In block 336, the second dry resist layer (not shown) can be removed from the structure 119. In one embodiment, removing the second dry resist layer can further include striping the dry film resist layer from the structure 119. Removing the dry resist layer can use a liquid resist stripper, which chemically alters the resist so that it no longer adheres to the underlying layers. The resist stripper can comprise organic materials specifically formulated to remove the dry resist layer. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the dry resist layer can further include etching the structure 119. In another embodiment, the etching can include a flash etch. In one embodiment, the dry resist film can be etched with a piranha etch, including sulfuric acid and hydrogen peroxide.

In one embodiment, the removal of the dry resist layer may be controlled approximately using the etching time and the known etch rate. In one embodiment, the etching entirely removes the dry resist layer of the structure 119, without damaging the underlying layers. This can be done in part based on the ratio of etch rates in the two materials (selectivity). In various embodiments, the etching can include an anisotropic etch that produces sharp, well-controlled features.

In block 338, a first photoresist layer 124 can be formed on the second pads 122 and the second patterned photoimagable dielectric layer 120. In one embodiment, the formation of the first photoresist layer 124 further comprises laminating the first photoresist layer 124 on the second pad and the second patterned photoimagable dielectric layer 120. In another embodiment, the first photoresist layer 124 may be deposited by any suitable mechanism including, but not limited to, physical vapor deposition, chemical vapor deposition, sputtering, metal paste deposition, combinations thereof, or the like.

In various embodiments, a laminator roll temperature of approximately 100° C. to approximately 115° C. (approximately 212-approximately 239° F.) can be used to form the first photoresist layer; a speed in units of m/min (equivalently ft/min) of approximately 2.0 m/min with a tolerance of approximately 1.0 m/min (equivalently, approximately 6.5 ft/min with a tolerance of approximately 3.3 ft/min) can be used to form the first photoresist layer; a pressure in units of $kg/cm^2$ (or equivalently in PSI) of approximately 2.5 $kg/cm^2$ with a tolerance of approximately 1.5 $kg/cm^2$ (equivalently, approximately 40 PSI with a tolerance of approximately 20 PSI) can be used to form the first photoresist layer.

In block 340, the first photoresist layer 124 can be processed to pattern the first photoresist layer 124. In one embodiment, processing the first photoresist layer 124 can further include exposing the first photoresist layer 124 using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not limited to, approximately 436 nm, approximately 365 nm, approximately 248 nm, and approximately 193 nm. In one embodiment, there can be a one-to-one correspondence between the mask pattern and the photoresist layer 124 pattern, for example, using one-to-one mask aligners. In other embodiments, steppers and scanners with reduction optics can be used to project and shrink the pattern by four or five times onto the surface of the first photoresist layer 124. To achieve complete coverage, the photoresist layer 124 is repeatedly "stepped" from position to position under the optical column until full exposure is achieved.

In one embodiment, processing the first photoresist layer 124 can further include developing the first photoresist layer 124 using an ultraviolet light source. In one embodiment, the light types that can be used to image the first photoresist layer 124 can include, but not be limited to, UV, DUV (Deep UV), and the g and I lines having wavelength of approximately 436 nm and approximately 365 nm respectively of a mercury-vapor lamp. In various embodiments, the development of the first photoresist layer 124 can include an exposure to the ultraviolet light source for a few seconds through the mask. The areas of the first photoresist layer 124 which are exposed stay, and the rest of the first photoresist layer 124 is developed. In one embodiment, the developing light wavelength parameter can be related to the thickness of the applied first photoresist layer 124, with thinner layers corresponding to shorter wavelengths. This can permit a reduced aspect ratio and a reduced minimum feature size.

In one embodiment, various chemicals may be used for permanently giving the first photoresist layer 124 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the first photoresist layer 124 further comprises curing the first photoresist layer 124 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can include a HEPA filter to produce Class 10 (ISO Class 4) air quality. Moreover, the oven can be configured to have low oxygen levels to prevent oxidation of any of the layers.

In block 342, the structure 121 can be removed from the carrier 104 comprising the first metal layer 106. In one embodiment, removing the structure 121 can further include striping the structure 121 from the carrier 104 comprising the first metal layer 106. Removing the structure 121 can use a liquid resist stripper, which chemically alters the structure so that it no longer adheres to the underlying layers. The resist stripper can comprise organic materials specifically formulated to remove the structure. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the structure 121 can further include etching the structure 121. In another embodiment, the etching can include a flash etch. In one embodiment, the second structure 121 can be etched with a piranha etch, including sulfuric acid and hydrogen peroxide. In one embodiment, the removal of the structure 121 may be controlled approximately using the etching time and the known etch rate. In one embodiment, the etching entirely removes the structure 121, without damaging the underlying layers. This can be done in part based on the ratio of etch rates in the two materials (selectivity). In various embodiments, the etching can include an anisotropic etch that produces sharp, well-controlled features.

Figure 4A:
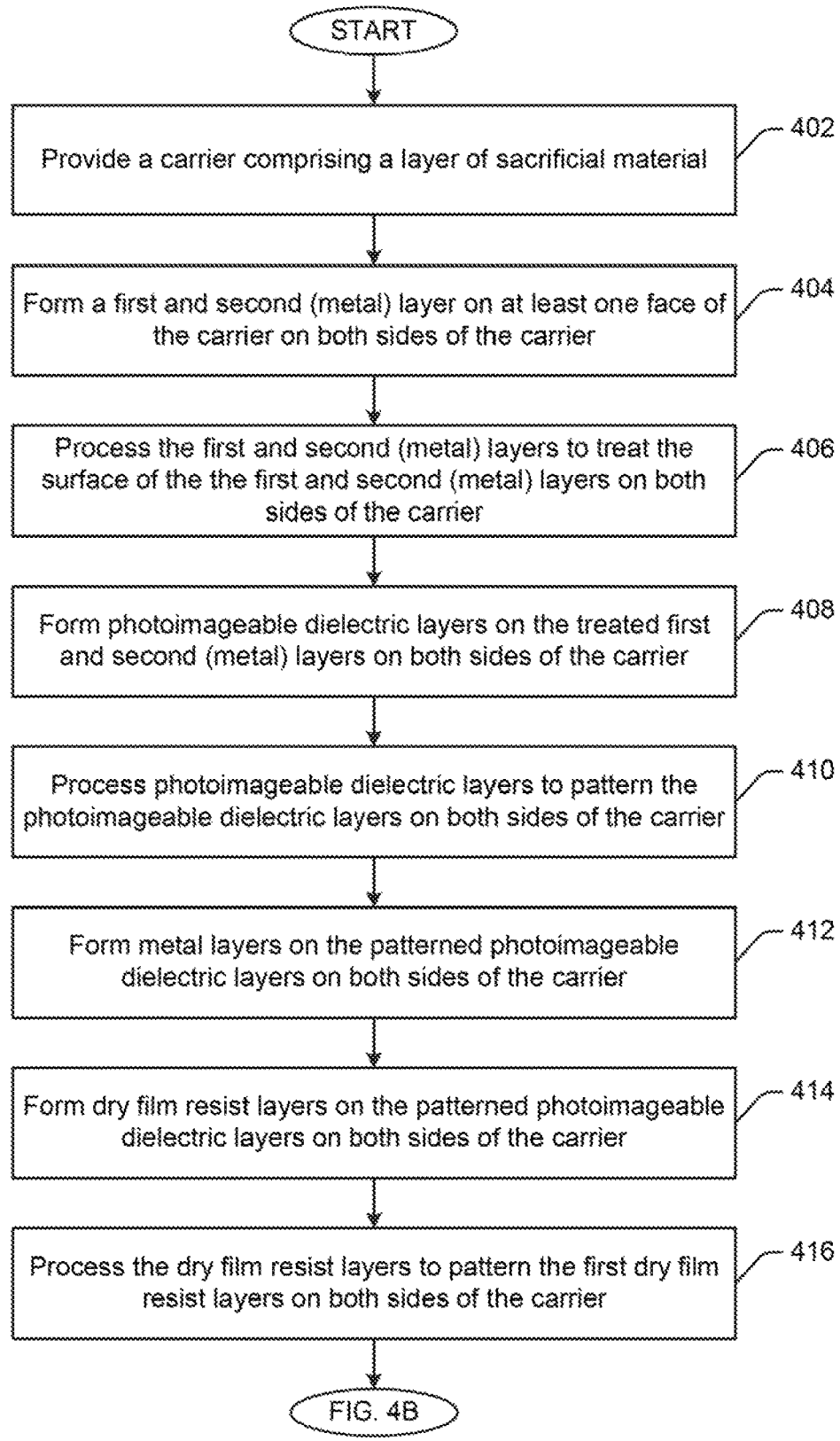

FIG. 4 shows a diagram of an example flow chart for the fabrication flow related to various embodiments of the disclosure, for example, in the fabrication of the structures of FIG. 2. As such, reference will be made to the corresponding elements of FIG. 2 for ease of understanding, but should not be construed to be limited to the embodiments described in connection with FIG. 2.

In block 402, a carrier 104 comprising a layer of sacrificial material can be provided. The sacrificial material can include, but not be limited to, a thin slice of material such as silicon, silicon dioxide, aluminum oxide, sapphire, germanium, gallium arsenide (GaAs), an alloy of silicon and germanium, or indium phosphide (InP).

In block 404, first layers 106 on the carrier 104 can be formed on both sides of the carrier 104. In one embodiment, the first layers 106 can comprise a first metal layers. The metal layers can include, but not be limited to, aluminum, silver, copper, and the like, and/or an alloy of aluminum, silver, copper, combinations thereof, or the like. The metal layer may be of any suitable thickness. In another embodiment, the first layers 102 and 106 can be any suitable thickness, for example, approximately 1 µm to approximately 1,000 µm thick, with a further example thickness of approximately 15 µm to approximately 30 µm thick.

In various embodiments, the first layers 106 can comprise a metallic, semi-metallic, or intermetallic material. In various embodiments, the layers 106 can comprise a metallic material. Non-limiting examples include gold, copper, silver, aluminum, zinc, tin, platinum, and any of the like. Metallic materials may also be any alloys of such materials.

In various embodiments, the layers 106 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the layers 106 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

The layers 106 can be deposited via sputtering, paste printing, squeegee, atomic layer deposition (ALD), or a variety of different physical vapor deposition (PVD) techniques. The layers 106 may be laminated on top of the carrier 104 by any suitable process, including, for example, cold roll or hot roll. In example embodiments, the layers 106 may be hot pressed on top of the carrier 104 at a predetermined temperature and pressure. Additionally the layers 106 can be deposited via any of the above mentioned techniques (or others that are not explicitly named herein) and then picked and placed on the carrier 104, or laminated thereon, or positioned atop the carrier 104 via any other technique.

From hereinout, the layers can be referred to simply as metal layers, though it should be understood that the first and second layers can include metallic, semi-metallic, and intermetallic materials.

In block 406, the metal layers 106 can be processed to treat the surface of the layers 106 and produce treated metal layers 108 on both sides of the carrier.

The processing can further include a copper roughening treatment of the metal layers 106, for example, to promote the adhesion of following layer depositions, e.g., polymer layers as described below. The copper roughening treatment can include the application of a surface roughening agent, for example, an organic acid-type microetching solution, that creates a roughened surface of the metal layer 106. The roughened metal surface topography can help to achieve high metal-to-dry film, polymer and/or resin adhesion. In one embodiment, the metal roughening treatment can make the metal layer 108 have approximately a 0.1 µm to an approximately 5 µm average surface roughness, as measured, for example, by a surface profile measurement. In one embodiment, the surface roughness of the first metal layer 108 can be increased by applying the surface roughening treatment on the surface of the metal layer 108 for a longer period of time, for example, approximately 10 minutes versus approximately 20 minutes.

Alternatively or additionally, in another embodiment, the processing can further include an adhesion promoting treatment of the layers 106. The adhesion promotion treatment can include a liquid or gaseous adhesion promoter, such as bis(trimethylsilyl)amine ("hexamethyldisilazane", HMDS), being applied to promote adhesion of the photoimagable dielectric layers (see below). The adhesion promotion treatment can be used to enhance the fine line space (FLS) of the semiconductor package. This FLS can lead to better routing, better form factor, and/or better substrate design parameters.

In block 408, photoimagable dielectric layers 110 on the treated the metal layers 108 can be formed on both sides of the carrier 104. In one embodiment, the formation of the photoimagable dielectric layers 110 further comprises laminating the first photoimagable dielectric layer 110 on the treated metal layers 108. In another embodiment, the photoimagable dielectric layers 110 may be deposited by any suitable mechanism including, but not limited to, physical vapor deposition, chemical vapor deposition, sputtering, metal paste deposition, combinations thereof, or the like.

In one embodiment, the light types that can be used to image the photoimagable dielectric layers 110 can include, but not be limited to, UV, DUV (Deep UV), and the g and I lines having wavelength of approximately 436 nm and approximately 365 nm, respectively, of a mercury-vapor lamp. In one embodiment, the developing light wavelength parameter can be related to the thickness of the applied photoimagable dielectric layer 110, with thinner layers corresponding to shorter wavelengths. This can permit a reduced aspect ratio and a reduced minimum feature size.

In one embodiment, various chemicals may be used for permanently giving the photoimagable dielectric layers 110 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, the photoimagable dielectric layers 110 can include dry films. The dry films can stand alone amongst the other types in that the coating already exists as a uniform thickness, semi-solid film coated onto polyester substrates and the user applies that substrate to the treated metal layers 108 by lamination.

In block 410, the photoimagable dielectric layers 110 can be processed to pattern the photoimagable dielectric layers 110 on both sides of the carrier. In one embodiment, processing the photoimagable dielectric layers 110 can further include exposing the photoimagable dielectric layers 110 using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including, but not be limited to, approximately 436 nm, approximately 365 nm, approximately 248 nm, and approximately 193 nm. In one embodiment, there can be a one-to-one correspondence between the mask pattern and the photoimagable dielectric layer pattern, for example, using one-to-one mask aligners. In other embodiments, steppers and scanners with reduction optics can be used to project and shrink the pattern by four or five times onto the surface of photoimagable dielectric layers 110. To achieve complete coverage, the photoimagable dielectric layers 110 are repeatedly "stepped" from position to position under the optical column until full exposure is achieved.

In one embodiment, processing the photoimagable dielectric layers 110 can further include developing the photoimagable dielectric layers 110 using an ultraviolet light source. In one embodiment, the light types that can be used to image photoimagable dielectric layers 110 can include, but not be limited to, UV, DUV (Deep UV), and the g and I lines having wavelength of approximately 436 nm and approximately 365 nm respectively of a mercury-vapor lamp. In various embodiments, the development of the photoimagable dielectric layers 110 can include an exposure to the ultraviolet light source for a few seconds through the mask. The areas of the photoimagable dielectric layers 110 which are exposed stay, and the rest of the photoimagable dielectric layers 110 are developed. In one embodiment, the developing light wavelength parameter can be related to the thickness of the applied photoimagable dielectric layers 110, with thinner layers corresponding to shorter wavelengths. This can permit a reduced aspect ratio and a reduced minimum feature size.

In one embodiment, various chemicals may be used for permanently giving the photoimagable dielectric layers 110 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the photoimagable dielectric layers 110 further comprises curing the photoimagable dielectric layers 110 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In block 412, metal layers 114 on the patterned photoimagable dielectric layers 110 can be formed on both sides of the carrier. In one embodiment, the forming the metal layers 114 can further include electrodeless plating the metal layers 114 on the patterned photoimagable dielectric layers 110.

Electroless plating, also known as chemical or auto-catalytic plating, can refer to a non-galvanic plating method that involves several simultaneous reactions in an aqueous solution, which occur without the use of external electrical power. The solution for the electroless process may need to contain a reducing agent. Electroless plating can use a redox reaction to deposit metal on an object without the passage of an electric current. Because it allows a constant metal ion concentration to bathe all parts of the object, it can deposit metal evenly along edges, inside holes, and over irregularly shaped objects which are difficult to plate evenly with electroplating.

In one embodiment, the metal layers 114 can include copper layers. The formation of the metal layers can be done at least in part by a wet process and/or a sputter type process. Copper can be plated by reducing complexed copper with formaldehyde in alkaline solution. The reaction can be catalyzed by palladium.

Alternatively or additionally, in various embodiments, a sputter seed process can be used for the formation of the metal layers 114. The sputtering process can be performed, for example, to increase the fine line spacing (FLS) of the semiconductor package. The sputter seed process can include sputtering of a Ti/Cu layer, or a Cu alloy layer. The sputtering can be, for example, a radio-frequency (RF) sputtering deposition, an ion-beam sputtering deposition, a reactive sputtering deposition, ion-assisted sputtering deposition, high-target-utilization sputtering deposition, and/or gas flow sputtering deposition.

In block 414, dry film resist layers (not shown) on the patterned photoimagable dielectric layers can be formed on both sides of the carrier. In one embodiment, the formation of the dry film layers further comprises laminating the dry film layers on the patterned photoimagable dielectric layers. In another embodiment, the dry film resist layers may be deposited by any suitable mechanism including, but not limited to, physical vapor deposition, chemical vapor deposition, sputtering, metal paste deposition, combinations thereof, or the like.

In various embodiments, a laminator roll temperature of approximately 100° C. to approximately 115° C. (approximately 212-approximately 239° F.) can be used to form the dry film layer; a speed in units of m/min (equivalently ft/min) of approximately 2.0 m/min with a tolerance of approximately 1.0 m/min (equivalently, approximately 6.5 ft/min with a tolerance of approximately 3.3 ft/min) can be used to form the dry film layer; a pressure in units of kg/cm$^2$ (or equivalently in PSI) of approximately 2.5 kg/cm$^2$ with a tolerance of approximately 1.5 kg/cm$^2$ (equivalently, approximately 40 PSI with a tolerance of approximately 20 PSI) can be used to form the dry film layers.

In block 416, the dry film resist layers can be processed to pattern the first dry film resist layers on both sides of the carrier. In various embodiments, the processing of the dry film resist layers can be performed using various tools including, but not limited to, a negative developer, an exposure kit, transparency film, and a foam brush, a laminator, a cutting device (for example, a sharp scissors or fabric cutter), and/or a safelight (for example, a working area lit by a yellow or red 40 watt incandescent bulb).

The formation of the first dry film resist layers can further include, generally, creating a safelight environment, the application of the dry film resist layers, exposure of the dry film resist layers, development of the dry film resist layers, and stripping (after use) of the dry film resist layers. In an embodiment, the dry film resist layers can be exposed by ambient light, so a dimly lit work area may be used. A darkroom lit by a red or yellow 40 watt incandescent bulb may be optimal. For the laminator, the following parameters may be used: a seal bar temperature of approximately 50° C. to approximately 80° C. (approximately 120° F. to approximately 176° F.).

In one embodiment, processing the first dry film resist layers can further include exposing the dry film resist layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not be limited to, approximately 436 nm, approximately 365 nm, approximately 248 nm, and approximately 193 nm. In one embodiment, there can be a one-to-one correspondence between the mask pattern and the dry film resist layers pattern, for example, using one-to-one mask aligners. In other embodiments, steppers and scanners with reduction optics can be used to project and shrink the pattern by four or five times onto the surface of the dry film resist layers. To achieve complete coverage, the dry film resist layers are repeatedly "stepped" from position to position under the optical column until full exposure is achieved.

In one embodiment, processing the dry film resist layers can further include developing the dry film resist layers using an ultraviolet light source. In one embodiment, the light types that can be used to image the photoimagable dielectric layers can include, but not be limited to, UV, DUV (Deep UV), and the g and I lines having wavelength of approximately 436 nm and approximately 365 nm respectively of a mercury-vapor lamp. In various embodiments, the development of the first dry film resist layer can include an exposure to the ultraviolet light source for a few seconds through the mask. The areas of the first dry film resist layer which are exposed stay, and the rest of the first dry film resist layer is developed.

In one embodiment, the developing light wavelength parameter can be related to the thickness of the applied dry film resist layers, with thinner layers corresponding to shorter wavelengths. This can permit a reduced aspect ratio and a reduced minimum feature size.

In one embodiment, various chemicals may be used for permanently giving the dry film resist layers the desired property variations. The chemicals can include, but not be limited to, poly(methyl methacrylate) (PMMA), poly(m-ethyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the dry film resist layers further comprises curing the dry film resist layers using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using high-efficiency particulate arrestance (HEPA) filtration of the air inside the oven. In one embodiment, the HEPA filter use can include a HEPA filter to produce Class 10 (International Organization for Standardization (ISO) Class 4) air quality. Moreover, the oven can be configured to have low oxygen levels to prevent oxidation of any of the layers.

In block 418, pads 118 can be formed in the patterned dry film resist layers and the patterned photoimagable dielectric layers 110 on both sides of the carrier to produce a first structure 205. The forming of the pads 118 can further include electrolytic plating (also known as electroplating) pad metal layers in the patterned dry film resist layers and the patterned photoimagable dielectric layers.

In one embodiment, the electroplating can use electrodeposition, for example, using electric current to reduce dissolved metal cations so that they form a coherent metal coating in contact with the metal layers. The structure up till this point in fabrication can be immersed in a solution (called an electrolyte) containing one or more dissolved metal salts as well as other ions that permit the flow of electricity. A power supply can be used to supply a direct current to the anode, oxidizing the metal atoms that it comprises and allowing them to dissolve in the solution. At the metal layers (which can act as the cathode of the circuit), the dissolved metal ions in the electrolyte solution can be reduced at the interface between the solution and the metal layers, such that they "plate out" onto the metal layers. The rate at which the anode is dissolved is equal to the rate at which the cathode is plated, vis-a-vis the current through the circuit. In this manner, the ions in the electrolyte bath are continuously replenished by the anode.

In one embodiment, a first a seed layer of metal (for example, a copper seed layer) may be first generated for the electroplating process. This seed layer may be deposited by sputter technology. In one embodiment, the first step may include wetting of the structure 205. During this process all trenches and vias (for example, those created in the patterning) can be filled with water without any bubbles remaining. This can be performed using detergents or by ultrasound systems. The structure 205 can then be flooded with electrolyte or sprayed by a rotating set of nozzles. This process may require temperature control. The metal ions can thereby be discharged and deposited on the seed layer, which can act as the cathode. Finally the structure 205 may need to be cleaned and dried (for example, using an oven).

The pads 118 can comprise copper, but also other metals can be plated. Non-limiting examples include gold, silver, aluminum, zinc, tin, platinum, and any of the like. Metallic materials may also be any alloys of such materials.

In block 420, the dry film resist layers can be removed from the structure 205 on both sides of the carrier.

In one embodiment, removing the dry resist layers can further include striping the dry film resist layers from the structure 205.

Removing the dry resist layers can use a liquid resist stripper, which chemically alters the resist so that it no longer adheres to the underlying layers. The resist stripper can comprise organic materials specifically formulated to remove the dry resist layer. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the dry resist layers can further include etching the first structure 205. In another embodiment, the etching can include a flash etch. In one embodiment, the dry resist film layers can be etched with a piranha etch, including sulfuric acid and hydrogen peroxide.

In one embodiment, the removal of the dry resist layers may be controlled approximately using the etching time and the known etch rate. In one embodiment, the etching entirely removes the dry resist layer of the structure 205, without damaging the underlying layers. This can be done in part based on the ratio of etch rates in the two materials (selectivity). In various embodiments, the etching can include an anisotropic etch that produces sharp, well-controlled features.

In block 438, the foregoing steps represented in blocks 422-436 can be repeated to generate multiple photoimagable dielectric lamination layers (120 and 224) with embedded pads 121 and 228, including steps to laminate the photoimagable dielectric layers, expose the laminated photoimagable dielectric layers, develop the laminated photoimagable dielectric layers, cure the laminated photoimagable dielectric layers, plate the pads into the cured laminated photoimagable dielectric layer, and pattern the cured laminated photoimagable dielectric layer with the pads embedded therein. Further, the structure can be exposed and developed accordingly to produce cavities 223 and vias as shown in FIG. 2D.

In block 440, dies 230 can be attached at corresponding cavities 223 on both sides of the carrier 104. In one embodiment, the dies 230 can be attached with a die bonding film (DFB) on both sides of the carrier 104.

In block 442, photoimagable dielectric layers 232 can be formed on both sides of the carrier. This can include steps to laminate the photoimagable dielectric layers 232, expose the laminated photoimagable dielectric layers 232 with lithographic techniques, develop the laminated photoimagable dielectric layers 232, cure the laminated photoimagable dielectric layers 232, and pattern the cured laminated photoimagable dielectric layers 232.

In block 444, the photoimagable dielectric layers 232 can be plated with pads 234 on both sides of the carrier to form a structure 213. The forming of the pads 234 can further include electrolytic plating (also known as electroplating) pad metal layers 234 in the patterned photoimagable dielectric layers 232. In one embodiment, the electroplating can use electrodeposition, for example, using electric current to reduce dissolved metal cations so that they form a coherent metal coating in contact with the underlying pads 228.

The pads 234 can comprise copper, but also other metals can be plated. Non-limiting examples include gold, silver, aluminum, zinc, tin, platinum, and any of the like. Metallic materials may also be any alloys of such materials.

In block 446, the structure 213 can be detached from both sides of the carrier comprising the treated first metal layers.

In one embodiment, the detaching of the structure 213 can further include striping a first 250 and second portion 251 of the structure 213 from the carrier 104 comprising the treated first metal layers 106.

Removing the first 250 and second portion 251 of the structure 213 can include using a liquid resist stripper, which chemically alters the first 250 and second portion 251 portions of the structure 213 so that they no longer adhere to the underlying layers. The resist stripper can comprise organic materials specifically formulated to remove the first and second portions of structure. In one embodiment, the resist stripper can comprise a resist stripping solution composition of pH of approximately 5 to approximately 8 containing a salt of acid with a base free from metal ions, a water-soluble organic solvent and water optionally together with a corrosion inhibitor.

In one embodiment, removing the first 250 and second portion 251 of structure 213 can further include etching the first 250 and second portion 251 of structure 213. In another embodiment, the etching can include a flash etch. In one embodiment, the dry resist films can be etched with a piranha etch, including sulfuric acid and hydrogen peroxide.

In one embodiment, the removal of the first 250 and second portion 251 of structure 213 may be controlled approximately using the etching time and the known etch rate. In one embodiment, the etching entirely removes first 250 and second portion 251 of structure 213, without damaging the underlying layers. This can be done in part based on the ratio of etch rates in the two materials (selectivity). In various embodiments, the etching can include an anisotropic etch that produces sharp, well-controlled features.

In block 448, photoresist layers 236 can be formed on the photoimagable dielectric layer 232 plated with pads therein on the detached first 250 and second portion 251 of the structure 213.

In one embodiment, the formation of the photoresist layers further comprises laminating the photoresist layers on the photoimagable dielectric layer 232 plated with pads therein 234. In another embodiment, the photoresist layers 236 may be deposited by any suitable mechanism including, but not limited to, physical vapor deposition, chemical vapor deposition, sputtering, metal paste deposition, combinations thereof, or the like.

In various embodiments, a laminator roll temperature of approximately 100° C. to approximately 115° C. (approximately 212-approximately 239° F.) can be used to form the photoresist layers; a speed in units of m/min (equivalently ft/min) of approximately 2.0 m/min with a tolerance of approximately 1.0 m/min (equivalently, approximately 6.5 ft/min with a tolerance of approximately 3.3 ft/min) can be used to form the first photoresist layer; a pressure in units of kg/cm$^2$ (or equivalently in PSI) of approximately 2.5 kg/cm$^2$ with a tolerance of approximately 1.5 kg/cm$^2$ (equivalently, approximately 40 PSI with a tolerance of approximately 20 PSI) can be used to form the photoresist layers.

In block 450, the photoresist layers 236 can be processed to pattern the photoresist layers 236. In one embodiment, processing the photoresist layers can further include exposing the photoresist layers 236 using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomasks can be used at a predetermined wavelength, including, but not be limited to, approximately 436 nm, approximately 365 nm, approximately 248 nm, and approximately 193 nm. In one embodiment, there can be a one-to-one correspondence between the mask pattern and the photoresist layers pattern, for example, using one-to-one mask aligners. In other embodiments, steppers and scanners with reduction optics can be used to project and shrink the pattern by four or five times onto the surface of the photoresist layers 236. To achieve complete coverage, the photoresist layers 236 can be repeatedly "stepped" from position to position under the optical column until full exposure is achieved.

In one embodiment, processing the photoresist layers 236 can further include developing the photoresist layers 236 using an ultraviolet light source. In one embodiment, the light types that can be used to image the photoresist layers 236 can include, but not be limited to, UV, DUV (Deep UV), and the g and I lines having wavelength of approximately 436 nm and approximately 365 nm respectively of a mercury-vapor lamp. In various embodiments, the development of the photoresist layers 236 can include an exposure to the ultraviolet light source for a few seconds through the mask. The areas of the photoresist layers 236 which are exposed stay, and the rest of the photoresist layers 236 can be developed. In one embodiment, the developing light wavelength parameter can be related to the thickness of the applied photoresist layers 236, with thinner layers corresponding to shorter wavelengths. This can permit a reduced aspect ratio and a reduced minimum feature size.

In one embodiment, various chemicals may be used for permanently giving the photoresist layers 236 the desired property variations. The chemicals can include, but not be limited to, poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the photoresist layers 236 can further comprise curing the photoresist layers 236 using a heat source. The heat source can generate heat of a predetermined temperature of approximately 120° C. to approximately 140° C., approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can include a HEPA filter to produce Class 10 (ISO Class 4) air quality. Moreover, the oven can be configured to have low oxygen levels to prevent oxidation of any of the layers.

Figure 5:
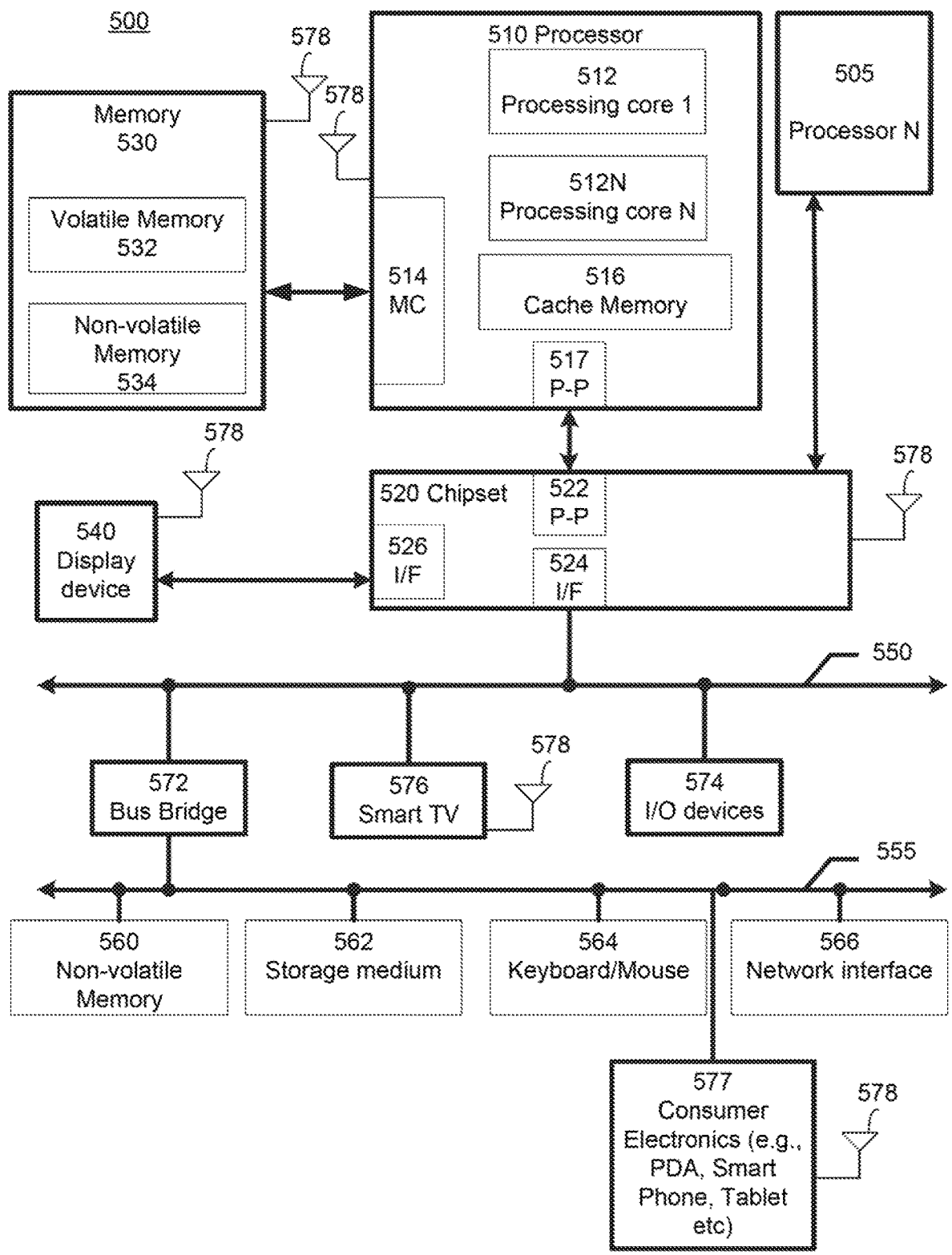
FIG. 5 depicts a system diagram, according to one or more example embodiment of the disclosure.

FIG. 5 depicts an example of a system 500 according to one or more embodiments of the disclosure. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 can include a system on a chip (SOC) system.

In one embodiment, system 500 includes multiple processors including processor 510 and processor N 505, where processor 505 has logic similar or identical to the logic of processor 510. In one embodiment, processor 510 has one or more processing cores (represented here by processing core 512 and processing core 512N, where 512N represents the Nth processor core inside processor 510, where N is a positive integer). More processing cores can be present (but not depicted in the diagram of FIG. 5). In some embodiments, processing core 512 includes, but is not limited to, pre-fetch logic to fetch instructions, decode logic to decode the instructions, execution logic to execute instructions, a combination thereof, or the like. In some embodiments, processor 510 has a cache memory 516 to cache instructions and/or data for system 500. Cache memory 516 may be organized into a hierarchical structure including one or more levels of cache memory.

In some embodiments, processor 510 includes a memory controller (MC) 514, which is configured to perform functions that enable the processor 510 to access and communicate with memory 530 that includes a volatile memory 532 and/or a non-volatile memory 534. In some embodiments, processor 510 can be coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interface 517 and P-P interface 522. Chipset 520 enables processor 510 to connect to other elements in system 500. In some embodiments of the disclosure, P-P interface 517 and P-P interface 522 can operate in accordance with a PtP communication protocol, such as the Intel® QuickPath Interconnect (QPI) or the like. In other embodiments, a different interconnect may be used.

In some embodiments, chipset 520 can be configured to communicate with processor 510, 505N, display device 540, and other devices 572, 576, 574, 560, 562, 564, 566, 577, etc. Chipset 520 may also be coupled to the wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the disclosure, processor 510 and chipset 520 are integrated into a single SOC. In addition, chipset 520 connects to bus 550 and/or bus 555 that interconnect various elements 574, 560, 562, 564, and 566. Bus 550 and bus 555 may be interconnected via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device(s) 562 can include, but not be limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 or selected elements thereof can be incorporated into processor core 512.

It is noted that the system 500 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-4), as disclosed herein, may be provided in any variety of electronic device including consumer, industrial, military, communications, infrastructural, and/or other electronic devices.

According to example embodiments of the disclosure, there may be a method to form a semiconductor package. The method may comprise: providing a carrier; forming a first metal layer on at least one face of the carrier; forming a first photoimagable layer on the first metal layer; forming at least one first pad at least partially disposed over the first photoimagable layer to produce a first structure; forming a second photoimagable layer at least partially disposed over the at least one first pad and the first photoimagable layer; forming at least one second pad at least partially disposed over the second photoimagable layer; forming a first photoresist layer at least partially disposed over the at least one first pad and the second photoimagable layer to produce a second structure; and removing, from the carrier, the second structure comprising the first photoresist layer.

Implementation may include one or more of the following features. The method wherein the processing the first metal layer to treat a surface of the first metal layer may further comprise a copper roughening treatment of the first metal layer and may further comprise an adhesion promoting treatment of the first metal layer. The method may further comprise processing the first photoimagable layer to pattern the first photoimagable layer. The method may further comprise forming of a second metal layer at least partially disposed over the patterned first photoimagable layer, forming a first dry film resist layer at least partially disposed over the patterned first photoimagable layer, or processing the first dry film resist layer to pattern the first dry film resist layer. Forming the second metal layer at least partially disposed over the patterned first photoimagable layer may further comprise electrodeless plating the second metal layer or sputter seed formation of the second metal layer. The method may further comprise a copper roughening treatment of a surface of at least one metal pad. The method may further comprise processing the second photoimagable layer to pattern the second photoimagable layer. The method may further comprise one or more of forming a third metal layer on the patterned second photoimagable layer, forming a second dry film resist layer on the patterned second photoimagable layer, or processing the second dry film resist layer to pattern the second dry film resist layer. Forming at least one first pad at least partially disposed over the first photoimagable layer to produce a first stricter may comprise electrolytic plating the at least one first pad metal layer.

According to example embodiments of the disclosure, there may be a semiconductor package. The semiconductor package may comprise: a carrier; a first metal layer on at least one face of the carrier; a first photoimagable layer on the first metal layer; a second metal layer on the first photoimagable layer; at least one first pad at least partially disposed over a first dry film resist layer and a patterned first photoimagable layer; a patterned second photoimagable layer at least partially disposed over the at least one first pad and the patterned first photoimagable layer; a second metal layer at least partially disposed over the patterned second photoimagable layer; at least one second pad at least partially disposed over the patterned second photoimagable layers; and; a first photoresist layer at least partially disposed over the at least one first pad and the second patterned photoimagable layer.

Implementation may include one or more of the following features. The first metal layer of the semiconductor package may comprise one or more of copper or tin. The first metal lay may further comprise a treated first metal layer, the treated metal layer may comprise a copper roughening treated surface of the first metal layer or may comprise an adhesion promoting treated surface of the first metal layer. The second metal layer may comprise a sputter seed formed second metal layer which may further comprise one or more of a titanium or a copper seed layer formed second metal layer. The semiconductor package may further comprise one or more of a third metal layer at least partially disposed over the patterned second photoimagable layer and a second dry film resist layer at least partially disposed over the patterned second photoimagable layer. The second metal layer may further comprise an electrodeless plated second metal layer. The at least one first pad of the semiconductor package may further comprise an electrolytic plated first pad.

According to example embodiments of the disclosure, there may be a an electronic package. The electronic package may comprise a semiconductor package which may further comprise: providing a carrier; forming a first metal layer on at least one face of the carrier; forming a first photoimagable layer on the first metal layer; forming at least one first pad at least partially disposed over the first photoimagable layer to produce a first structure; forming a second photoimagable layer at least partially disposed over the at least one first pad and the first photoimagable layer; forming at least one second pad at least partially disposed over the second photoimagable layer; forming a first photoresist layer at least partially disposed over the at least one first pad and the second photoimagable layer to produce a second structure; and removing, from the carrier, the second structure comprising the first photoresist layer.

Implementation may include one or more of the following features. The device wherein the processing the first metal layer to treat a surface of the first metal layer may further comprise a copper roughening treatment of the first metal layer and may further comprise an adhesion promoting treatment of the first metal layer. The device may further comprise processing the first photoimagable layer to pattern the first photoimagable layer. The device may further comprise forming of a second metal layer at least partially disposed over the patterned first photoimagable layer, forming a first dry film resist layer at least partially disposed over the patterned first photoimagable layer, or processing the first dry film resist layer to pattern the first dry film resist layer. Forming the second metal layer at least partially disposed over the patterned first photoimagable layer may further comprise electrodeless plating the second metal layer or sputter seed formation of the second metal layer. The device may further comprise a copper roughening treatment of a surface of at least one metal pad. The device may further comprise processing the second photoimagable layer to pattern the second photoimagable layer. The device may further comprise one or more of forming a third metal layer on the patterned second photoimagable layer, forming a second dry film resist layer on the patterned second photoimagable layer, or processing the second dry film resist layer to pattern the second dry film resist layer. Forming at least one first pad at least partially disposed over the first photoimagable layer to produce a first stricter may comprise electrolytic plating the at least one first pad metal layer.

It will be appreciated that the apparatus described herein may be any suitable type of microelectronics packaging and configurations thereof, including, for example, system in a package (SIP), system on a package (SOP), package on package (PoP), interposer package, 3D stacked package, etc. In fact, any suitable type of microelectronic components may be provided in the semiconductor packages as described herein. For example, microcontrollers, microprocessors, baseband processors, digital signal processors, memory dies, field gate arrays, memory dies, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages, as disclosed herein, may be provided in any variety of electronic devices including; consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package may be disposed. The board may include a number of components, including but not limited to a processor and/or at least one communication chip. The processor may be physically and electrically connected to a board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A semiconductor package, comprising:
a carrier;
a first metal layer on at least one face of the carrier;
a first photoimagable layer on the first metal layer;
a second metal layer on the first photoimagable layer;
at least one first pad at least partially disposed over a first dry film resist layer and a patterned first photoimagable layer;
a patterned second photoimagable layer at least partially disposed over the at least one first pad and the patterned first photoimagable layer;
a second metal layer at least partially disposed over the patterned second photoimagable layer;
at least one second pad at least partially disposed over the patterned second photoimagable layers; and a first photoresist layer at least partially disposed over the at least one first pad and the second patterned photoimagable layer.

2. The semiconductor package of claim 1, wherein the first metal layer comprises one or more of copper or tin.

3. The semiconductor package of claim 1, wherein the first metal layer further comprises a treated first metal layer, the treated metal layer further comprising a copper roughening treated surface of the first metal layer.

4. The semiconductor package of claim 1, wherein the first metal layer further comprises a treated first metal layer, the treated metal layer further comprising an adhesion promoting treated surface of the first metal layer.

5. The semiconductor package of claim 1, wherein the second metal layer further comprises a sputter seed formed second metal layer.

6. The semiconductor package of claim 1, wherein the sputter seed formed second metal layer further comprises one or more of a titanium or a copper seed layer formed second metal layer.

7. The semiconductor package of claim 1, further comprising one or more of a third metal layer at least partially disposed over the patterned second photoimagable layer and a second dry film resist layer at least partially disposed over the patterned second photoimagable layer.

8. The semiconductor package of claim 1, wherein the second metal layer further comprises an electrodeless plated second metal layer.

9. The semiconductor package of claim 1, wherein the at least one first pad further comprises an electrolytic plated first pad.

10. A method to form a semiconductor package, the method comprising:
providing a carrier;
forming a first metal layer on at least one face of the carrier;
forming a first photoimagable layer on the first metal layer;
forming at least one first pad at least partially disposed over the first photoimagable layer to produce a first structure;
forming a second photoimagable layer at least partially disposed over the at least one first pad and the first photoimagable layer;
forming at least one second pad at least partially disposed over the second photoimagable layer;
forming a first photoresist layer at least partially disposed over the at least one first pad and the second photoimagable layer to produce a second structure; and
removing, from the carrier, the second structure comprising the first photoresist layer.

11. The method of claim 10, wherein the processing the first metal layer to treat a surface of the first metal layer further comprises a copper roughening treatment of the first metal layer.

12. The method of claim 11, wherein the processing the first metal layer to treat a surface of the first metal layer further comprises an adhesion promoting treatment of the first metal layer.

13. The method of claim 10, further comprising processing the first photoimagable layer to pattern the first photoimagable layer.

14. The method of claim 13, further comprising one or more of forming a second metal layer at least partially disposed over the patterned first photoimagable layer, forming a first dry film resist layer at least partially disposed over the patterned first photoimagable layer, or processing the first dry film resist layer to pattern the first dry film resist layer.

15. The method of claim 14, wherein the forming the second metal layer at least partially disposed over the patterned first photoimagable layer further comprises electrodeless plating the second metal layer.

16. The method of claim 14, wherein the forming the second metal layer at least partially disposed over the patterned first photoimagable layer further comprises sputter seed formation of the second metal layer.

17. The method of claim 10, further comprising a copper roughening treatment of a surface of the at least one first pad.

18. The method of claim 10, wherein the method further comprises processing the second photoimagable layer to pattern the second photoimagable layer.

19. The method of claim 18, wherein the method further comprises one or more of forming a third metal layer on the patterned second photoimagable layer, forming a second dry film resist layer on the patterned second photoimagable layer, or processing the second dry film resist layer to pattern the second dry film resist layer.

20. The method of claim 10, wherein the forming at least one first pad at least partially disposed over the first photoimagable layer to produce a first structure further comprises electrolytic plating the at least one first pad metal layer.

* * * * *